(12) United States Patent
Sasaki et al.

(10) Patent No.: US 11,444,599 B2
(45) Date of Patent: Sep. 13, 2022

(54) SUPPRESSION OF SPURIOUS SIGNALS IN SURFACE ACOUSTIC WAVE DEVICES

(71) Applicant: SKYWORKS SOLUTIONS, INC., Irvine, CA (US)

(72) Inventors: Riho Sasaki, Osaka-Fu (JP); Joji Fujiwara, Suita (JP)

(73) Assignee: SKYWORKS SOLUTIONS, INC., Irvine, CA (US)

(*) Notice: Subject to any disclaimer, the term of this patent is extended or adjusted under 35 U.S.C. 154(b) by 36 days.

(21) Appl. No.: 17/001,843

(22) Filed: Aug. 25, 2020

(65) Prior Publication Data

US 2021/0067127 A1 Mar. 4, 2021

Related U.S. Application Data

(60) Provisional application No. 62/893,414, filed on Aug. 29, 2019.

(51) Int. Cl.
| | |
|---|---|
| *H03H 9/145* | (2006.01) |
| *H03H 9/02* | (2006.01) |
| *H03H 9/13* | (2006.01) |
| *H03H 9/25* | (2006.01) |
| *H03H 9/64* | (2006.01) |

(52) U.S. Cl.
CPC ...... *H03H 9/1457* (2013.01); *H03H 9/02543* (2013.01); *H03H 9/13* (2013.01); *H03H 9/14541* (2013.01); *H03H 9/25* (2013.01); *H03H 9/6483* (2013.01)

(58) Field of Classification Search
CPC .... H03H 9/1457; H03H 9/02543; H03H 9/13; H03H 9/14541; H03H 9/25; H03H 9/6483; H03H 9/02858; H03H 9/02881
USPC .......................................... 333/133, 193–196
See application file for complete search history.

(56) References Cited

U.S. PATENT DOCUMENTS

| | | | |
|---|---|---|---|
| 2013/0249647 A1* | 9/2013 | Nakanishi | H03H 9/02834 333/186 |
| 2017/0047905 A1* | 2/2017 | Araki | H03H 9/1457 |
| 2017/0264262 A1* | 9/2017 | Nakazawa | H03H 9/64 |

* cited by examiner

*Primary Examiner* — Rakesh B Patel
*Assistant Examiner* — Jorge L Salazar, Jr.
(74) *Attorney, Agent, or Firm* — Lando & Anastasi, LLP

(57) ABSTRACT

An acoustic wave device comprises a substrate including a piezoelectric material, interdigital transducer (IDT) electrodes disposed on an upper surface of the substrate. The IDT electrodes having gap regions, edge regions, and center regions. A duty factor of the IDT electrodes in the edge regions is greater than the duty factor of the IDT electrodes in the center regions. A first dielectric film is disposed above the IDT electrodes and an upper surface of the substrate. The first dielectric film has a greater thickness in portions of the center regions than in portions proximate the gap regions.

19 Claims, 38 Drawing Sheets

SUPPRESSION OF SPURIOUS SIGNALS IN SURFACE ACOUSTIC WAVE DEVICES

CROSS-REFERENCE TO RELATED APPLICATIONS

This application claims priority under 35 U.S.C. § 119(e) to U.S. Provisional Patent Application No. 62/893,414, titled SUPPRESSION OF SPURIOUS SIGNALS IN SURFACE ACOUSTIC WAVE DEVICES, filed Aug. 29, 2019, the content of which being incorporated herein in its entirety for all purposes.

BACKGROUND

Technical Field

Embodiments of this disclosure relate to acoustic wave devices and to the suppression of transverse mode spurious signals in the acoustic wave devices and improvements in the quality factor of same.

Description of Related Technology

Acoustic wave devices, for example, surface acoustic wave (SAW) and bulk acoustic wave (BAW) devices may be utilized as components of filters in radio frequency electronic systems. For instance, filters in a radio frequency front-end of a mobile phone can include acoustic wave filters. Two acoustic wave filters can be arranged as a duplexer.

SUMMARY

In accordance with an aspect, there is provided an acoustic wave device. The acoustic wave device comprises a substrate including a piezoelectric material, interdigital transducer (IDT) electrodes disposed on an upper surface of the substrate, the IDT electrodes having gap regions, edge regions, and center regions, a duty factor of the IDT electrodes in the edge regions being greater than the duty factor of the IDT electrodes in the center regions, and a first dielectric film disposed above the IDT electrodes and an upper surface of the substrate, the first dielectric film having a greater thickness in portions of the center regions than in portions proximate the gap regions.

In some embodiments, a velocity of an acoustic wave in the center regions is greater than the velocity of the acoustic wave in the edge regions.

In some embodiments, the first dielectric film has a greater thickness in the center regions and portions of the edge regions proximate the center regions than in portions of the edge regions distal to the center regions. Lengths of the portions of the edge regions proximate the center regions may be less than lengths of the portions of the edge regions distal to the center regions. Lengths of the portions of the edge regions proximate the center regions may be at least as long as lengths of the portions of the edge regions distal to the center regions.

In some embodiments, the acoustic wave device further comprises a second dielectric film disposed between the first dielectric film and the IDT electrodes and the upper surface of the substrate, the second dielectric film exhibiting a lower acoustic velocity than the first dielectric film. The acoustic wave device may further comprise strips of a material having a density higher than the density of the second dielectric film disposed in the second dielectric film in the edge regions.

In some embodiments, the width of the IDT electrodes in the gap regions is less than the width of the IDT electrodes in the center regions.

In some embodiments, the acoustic wave device further comprises dummy IDT electrodes disposed in the gap regions.

In some embodiments, the duty factor of the dummy IDT electrodes is different from the duty factor of the IDT electrodes in the center regions and different from the duty factor of the IDT electrodes in the edge regions.

In some embodiments, the duty factor of the dummy IDT electrodes is less than the duty factor of the IDT electrodes in the center regions and less than the duty factor of the IDT electrodes in the edge regions.

In some embodiments, the IDT electrodes include a layer of tungsten.

In accordance with an aspect, there is provided an acoustic wave device. The acoustic wave device comprises a substrate including a piezoelectric material, and interdigital transducer (IDT) electrodes disposed on an upper surface of the substrate, the IDT electrodes having gap regions, edge regions, and center regions, a width of the IDT electrodes in the gap regions being less than the width of the IDT electrodes in the center regions.

In some embodiments, the duty factor of the IDT electrodes in the edge regions is greater than the duty factor of the IDT electrodes in the center regions.

In some embodiments, the acoustic wave device further comprises dummy IDT electrodes disposed in the gap regions.

In some embodiments, the duty factor of the dummy IDT electrodes is different from the duty factor of the IDT electrodes in the center regions and different from the duty factor of the IDT electrodes in the edge regions.

In some embodiments, the duty factor of the dummy IDT electrodes is less than the duty factor of the IDT electrodes in the center regions and less than the duty factor of the IDT electrodes in the edge regions.

In accordance with another aspect, there is provided a radio frequency filter. The radio frequency filter comprises at least one acoustic wave device, the at least one acoustic wave device including a substrate including a piezoelectric material, interdigital transducer (IDT) electrodes disposed on an upper surface of the substrate, the IDT electrodes having gap regions, edge regions, and center regions, a duty factor of the IDT electrodes in the edge regions being greater than the duty factor of the IDT electrodes in the center regions, and a dielectric film disposed above the IDT electrodes and an upper surface of the substrate, the dielectric film having a greater thickness in the center regions and portions of the edge regions proximate the center regions than in portions of the edge regions distal to the center regions.

In accordance with another aspect, there is provided an electronics module having at least one radio frequency filter including at least one acoustic wave device, the at least one acoustic wave device comprising a substrate including a piezoelectric material, interdigital transducer (IDT) electrodes disposed on an upper surface of the substrate, the IDT electrodes having gap regions, edge regions, and center regions, a duty factor of the IDT electrodes in the edge regions being greater than the duty factor of the IDT electrodes in the center regions, and a dielectric film disposed above the IDT electrodes and an upper surface of the substrate, the dielectric film having a greater thickness in the center regions and portions of the edge regions proximate the center regions than in portions of the edge regions distal to the center regions.

In accordance with another aspect, there is provided an electronic device with an electronics module having at least one radio frequency filter including at least one acoustic wave device, the at least one acoustic wave device comprising a substrate including a piezoelectric material, interdigital transducer (IDT) electrodes disposed on an upper surface of the substrate, the IDT electrodes having gap regions, edge regions, and center regions, a duty factor of the IDT electrodes in the edge regions being greater than the duty factor of the IDT electrodes in the center regions, and a dielectric film disposed above the IDT electrodes and an upper surface of the substrate, the dielectric film having a greater thickness in the center regions and portions of the edge regions proximate the center regions than in portions of the edge regions distal to the center regions.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1A:
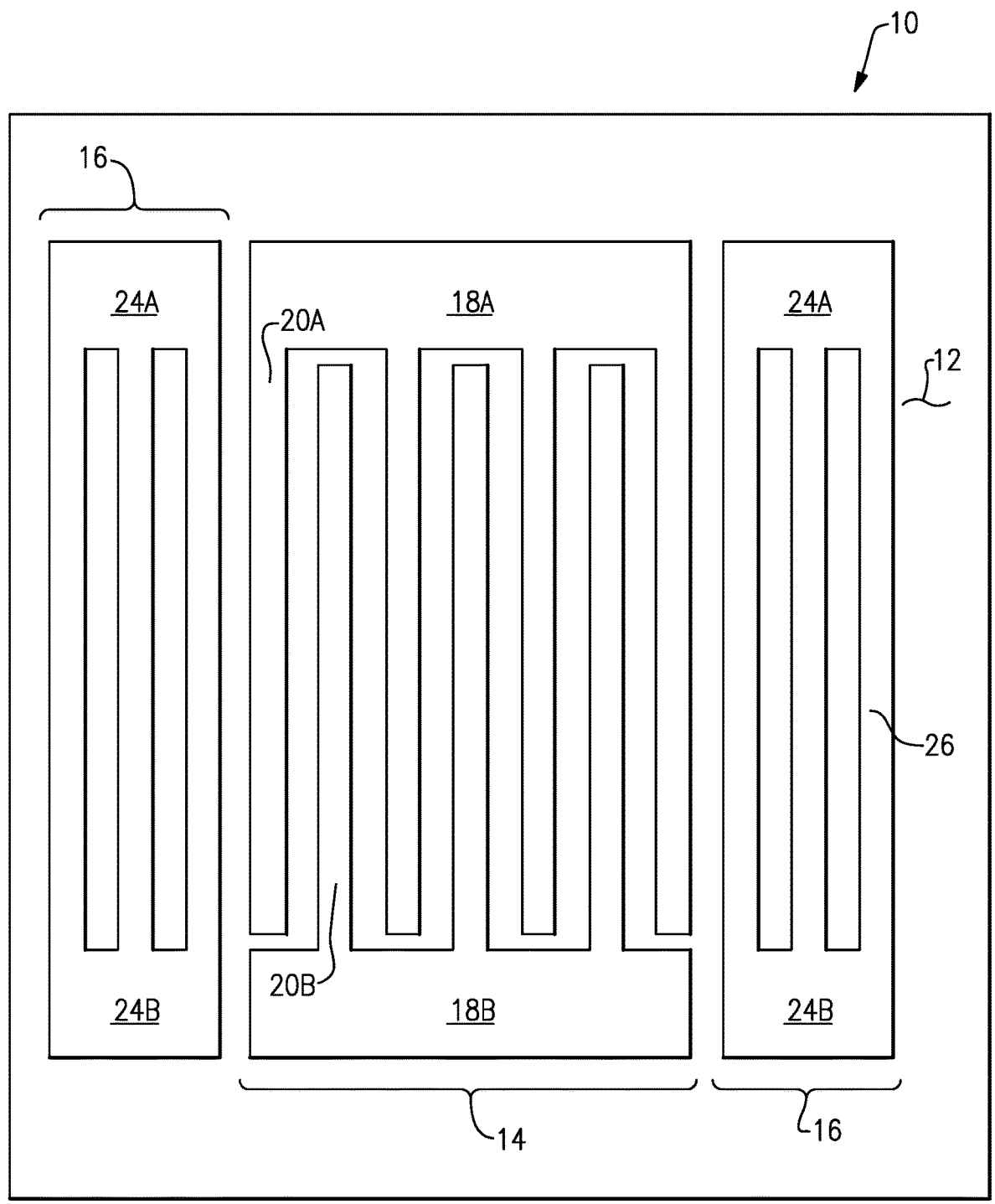
FIG. 1A is a simplified plan view of an example of a surface acoustic wave resonator.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1A is a plan view of a surface acoustic wave (SAW) resonator 10 such as might be used in a SAW filter, duplexer, balun, etc.

Acoustic wave resonator 10 is formed on a piezoelectric substrate, for example, a lithium tantalate (LiTaO$_3$) or lithium niobate (LiNbO$_3$) substrate 12 and includes Interdigital Transducer (IDT) electrodes 14 and reflector electrodes 16. In use, the IDT electrodes 14 excite a main acoustic wave having a wavelength λ along a surface of the piezoelectric substrate 12. The reflector electrodes 16 sandwich the IDT electrodes 14 and reflect the main acoustic wave back and forth through the IDT electrodes 14. The main acoustic wave of the device travels perpendicular to the lengthwise direction of the IDT electrodes.

The IDT electrodes 14 include a first bus bar electrode 18A and a second bus bar electrode 18B facing first bus bar electrode 18A. The bus bar electrodes 18A, 18B may be referred to herein and labelled in the figures as busbar electrode 18. The IDT electrodes 14 further include first electrode fingers 20A extending from the first bus bar electrode 18A toward the second bus bar electrode 18B, and second electrode fingers 20B extending from the second bus bar electrode 18B toward the first bus bar electrode 18A.

The reflector electrodes 16 (also referred to as reflector gratings) each include a first reflector bus bar electrode 24A and a second reflector bus bar electrode 24B (collectively referred to herein as reflector bus bar electrode 24) and reflector fingers 26 extending between and electrically coupling the first bus bar electrode 24A and the second bus bar electrode 24B.

Figure 1B:
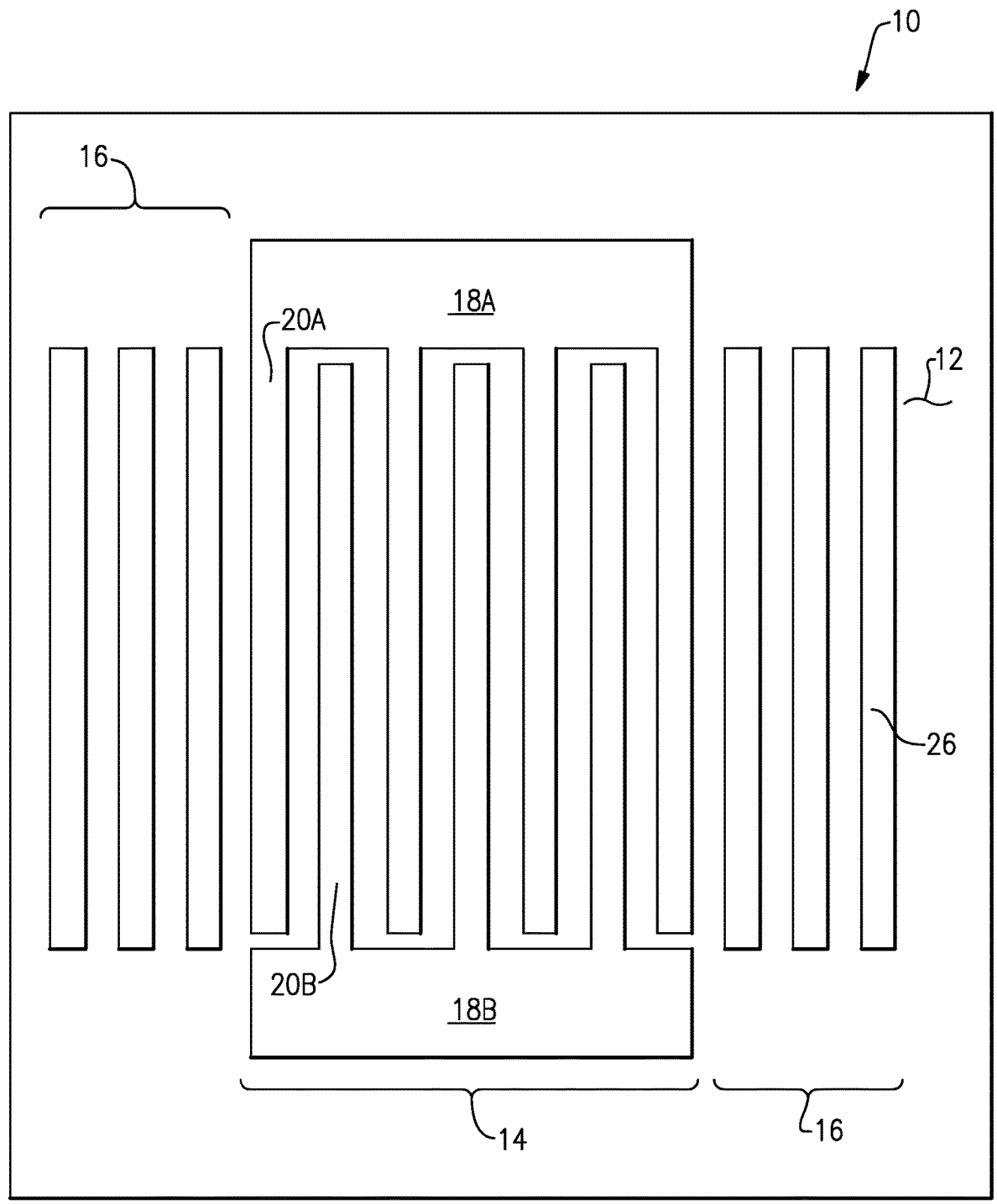
FIG. 1B is a simplified plan view of another example of a surface acoustic wave resonator.
Figure 1C:
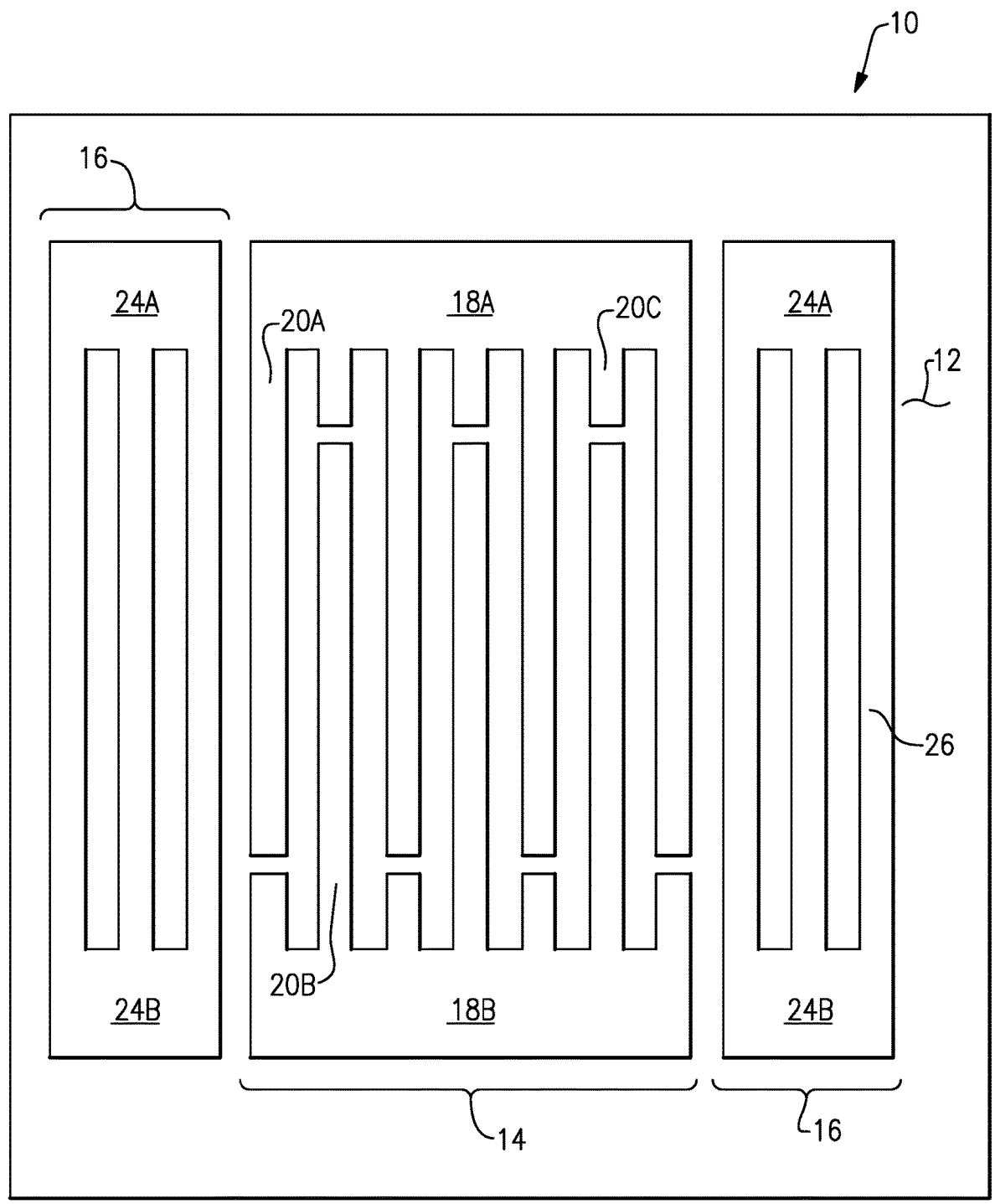
FIG. 1C is a simplified plan view of another example of a surface acoustic wave resonator.

In other embodiments disclosed herein, as illustrated in FIG. 1B, the reflector bus bar electrodes 24A, 24B may be omitted and the reflector fingers 26 may be electrically unconnected. Further, as illustrated in FIG. 1C, acoustic wave resonators as disclosed herein may include dummy electrode fingers 20C that are aligned with respective electrode fingers 20A, 20B. Each dummy electrode finger 20C extends from the opposite bus bar electrode 18A, 18B than the respective electrode finger 20A, 20B with which it is aligned.

It should be appreciated that the acoustic wave resonators 10 illustrated in FIGS. 1A-1C, as well as the other circuit elements illustrated in other figures presented herein, are illustrated in a highly simplified form. The relative dimensions of the different features are not shown to scale. Further, typical acoustic wave resonators would commonly include a far greater number of electrode fingers and reflector fingers than illustrated. Typical acoustic wave resonators or filter elements may also include multiple IDT electrodes sandwiched between the reflector electrodes.

Figure 2A:
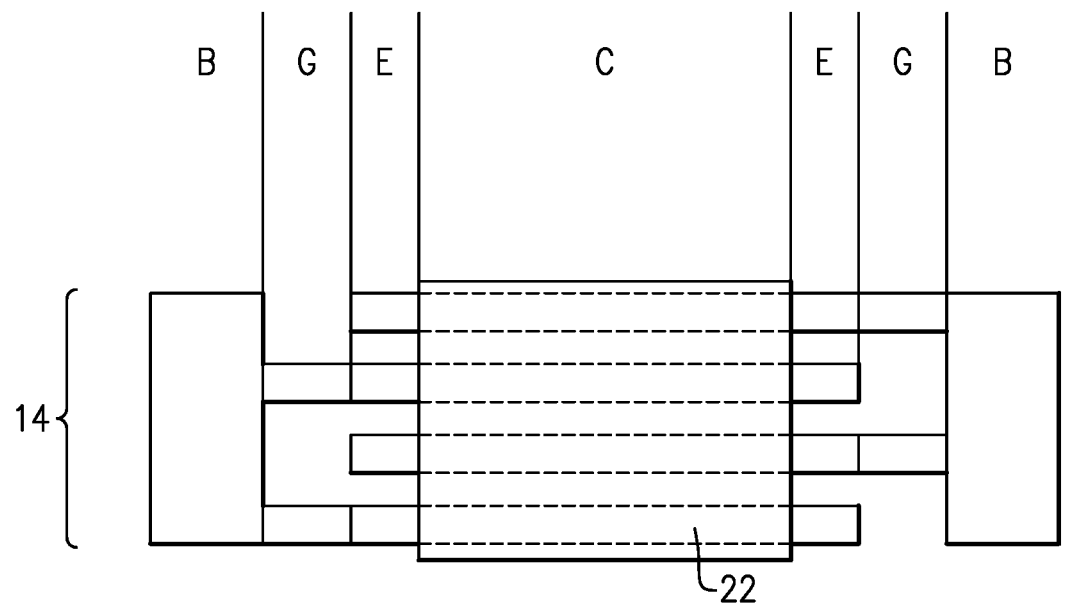
FIG. 2A is a plan view of a portion of electrodes of a surface acoustic wave filter including a structure for suppressing transverse mode spurious signals.
Figure 2B:
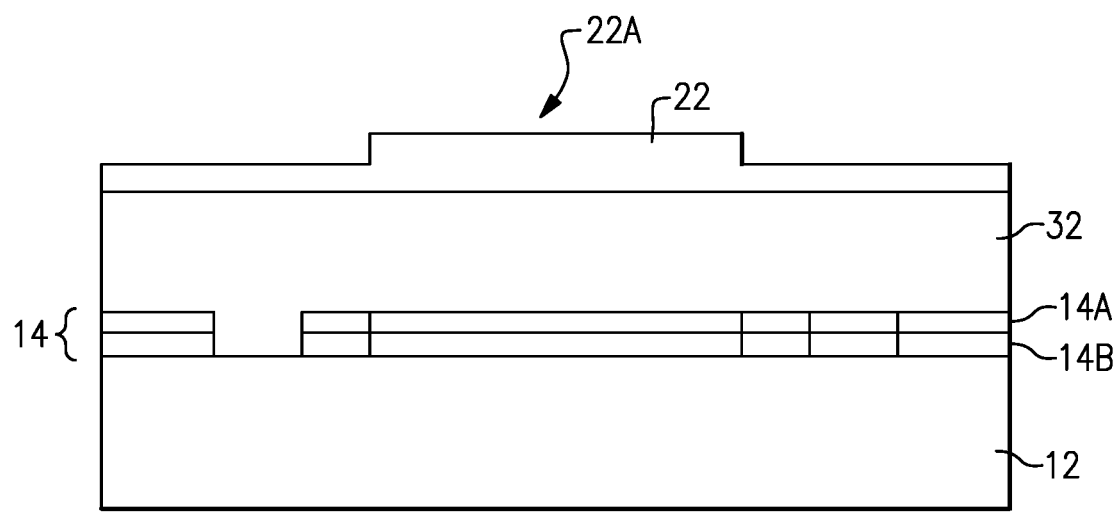
FIG. 2B is a cross-sectional view of a portion of a surface acoustic wave resonator including a dielectric stack structure for suppressing transverse mode spurious signals.

As illustrated in FIG. 2A, regions along lengths of the IDT electrodes of a SAW device, e.g., a SAW resonator, may be characterized as busbar regions "B" including the busbar portions of the IDT electrodes, gap regions "G" between the busbar of a first IDT electrode and the ends of the fingers of a second opposing IDT electrode, edge regions "E" including end portions of the IDT electrode fingers, and a center region "C" sandwiched between the edge regions. In some embodiments, the gap regions may have widths of between about 1 λ and 1.5 λ, the edge regions may have widths of between about 0.5 λ and 1.25 λ, and the center region may have a width of about 20 λ, where λ is the wavelength of the main acoustic wave generated by the SAW resonator. It should be understood that these dimensions are only examples and may vary based on the design of a particular resonator. In some embodiments, a layer of a dielectric 22 exhibiting a high acoustic wave velocity, for example, silicon nitride (Si$_3$N$_4$, also abbreviated as "SiN" herein) may be disposed over the IDT electrodes within the center region C. In some embodiments, as illustrated in FIG. 2B, the layer of high acoustic wave velocity material 22 may be deposited over a dielectric material 32 having a lower acoustic wave velocity, for example, silicon dioxide (SiO$_2$) disposed over the entire IDT electrode structure (regions B, G, E, and D). The layer of high acoustic wave velocity material 22 may include a thicker portion 22A disposed in the center region C than in the other regions B, G, and E. This SiN configuration is referred to herein as a SiN trench structure because it may be formed by depositing a layer of SiN with a uniform thickness on the SiO$_2$ layer and then etching trenches in the SiN in areas outside of the center region. In other embodiments the SiN layer may be present only in the center region C. The layer of high acoustic wave velocity material 22 disposed over the IDT electrodes in the center region C may help to confine acoustic waves to the center region C and reduce the amount of acoustic energy that travels outside of this region in a direction perpendicular to that of the propagation direction of the main acoustic wave in the device and that may cause transverse mode spurious signals in the frequency response of the SAW device. The main acoustic wave of the device travels perpendicular to the lengthwise direction of the IDT electrodes and the transverse mode spurious signals may be caused by acoustic waves travelling parallel to the lengthwise direction of the IDT electrodes.

The SiO$_2$ layer 32 may have a negative temperature coefficient of frequency, which helps to offset the positive temperature coefficient of frequency of the piezoelectric substrate 12 and reduce the change in frequency response of the SAW device with changes in temperature. A SAW device with a layer of SiO$_2$ over the IDT electrodes may thus be referred to as a temperature-compensated SAW device, or TCSAW.

As also illustrated in FIG. 2B, the IDT electrodes 14 may be layered electrodes including an upper layer 14A of a highly conductive but low-density material, for example, aluminum (Al), and a lower layer 14B of a less conductive, but more dense material, for example, molybdenum (Mo) or tungsten (W). The denser lower layer 14B may reduce the acoustic velocity of acoustic waves travelling through the device which may allow the IDT electrode fingers to be spaced more closely for a given operating frequency and allow the SAW device to be reduced in size as compared to a similar device utilizing less dense IDT electrodes. The less dense upper layer 14A may have a higher conductivity than the lower layer 14B to provide the electrode stack with a lower overall resistivity than an electrode including only the denser lower layer 14B.

Figure 2C:
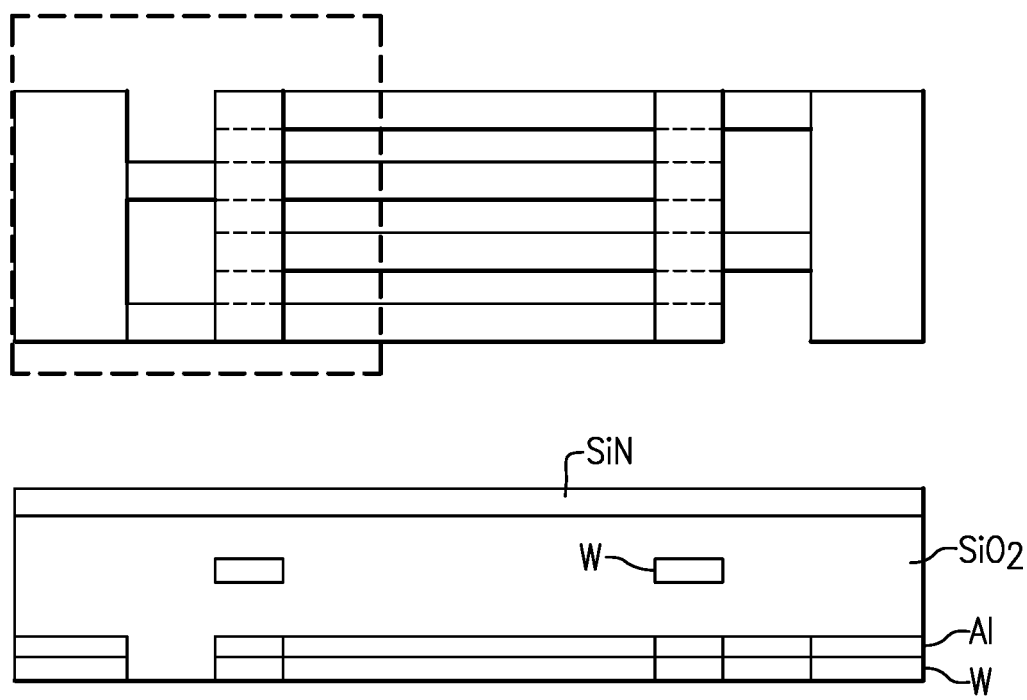
FIG. 2C illustrates a portion of a surface acoustic wave resonator including a high-density strip structure for suppressing transverse mode spurious signals in plan and cross-sectional views.

Another method that may be utilized to confine the acoustic waves to the center region C of a SAW device may be to include strips of a material having a higher density than SiO$_2$, for example, Mo, W or another metal or high-density dielectric material, within the SiO$_2$ layer in the edge regions of the device. FIG. 2C includes a cross-section of an example of a SAW device with this configuration. The high-density material strips may be completely embedded in the SiO$_2$ layer away from both the upper and lower surfaces of the SiO$_2$ layer. The high-density material strips decrease the acoustic velocity in the edge regions relative to the center regions which aids in keeping the acoustic waves generated during operation of the device within the center region.

Consumers and device manufactures continue to demand electronic products such as cellular telephones with smaller form factors and/or that include additional functionality. Accordingly, there is a continuing demand for smaller and smaller electronic components used in these electronic products, for example, SAW resonators and filters that are incorporated in same. A method of decreasing the size of a SAW resonator while maintaining the operating frequency of the SAW resonator includes increasing the density of the IDT electrodes of the SAW resonator. Higher density IDT electrodes result in a reduced velocity and reduced wavelength of acoustic waves generated in the SAW resonator, which allows denser IDT electrodes to be spaced closer to each other than less dense IDT electrodes to achieve the same operating frequency. In many examples of previously and currently available SAW resonators, the IDT electrodes were formed of Mo, often with a layer of Al on top of the Mo to increase the conductivity of the IDT electrodes. To increase the density of the IDT electrodes, the Mo layer of the IDT electrodes may be replaced with a layer of a higher density material, for example, W.

Figure 3B:
FIG. 3B illustrates transverse spurious mode signals generated in a SAW resonator including IDT electrodes with a tungsten layer.
Figure 3A:
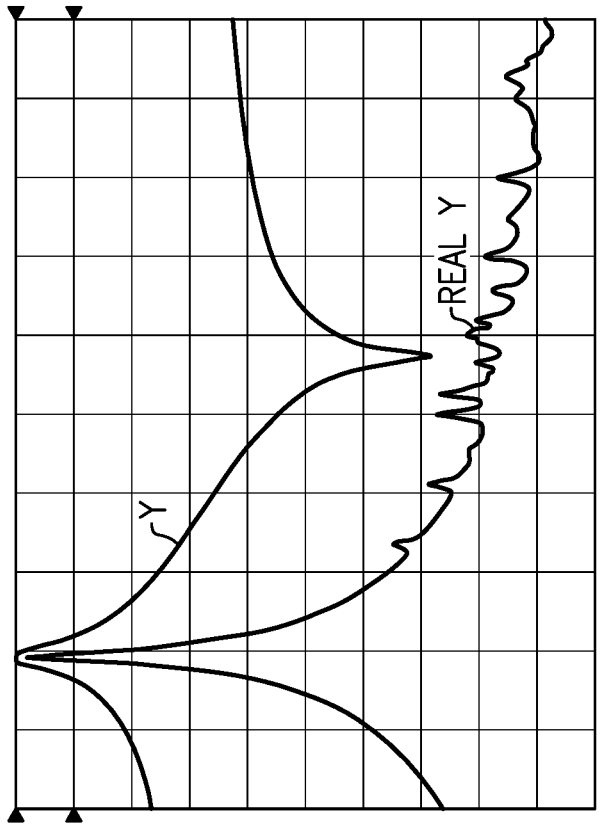
FIG. 3A illustrates transverse spurious mode signals generated in a SAW resonator including IDT electrodes with a molybdenum layer.

It has been discovered that when the Mo layer in IDT electrodes of examples of SAW resonators is replaced with W, previously utilized structures, such as the layer of high acoustic wave velocity material 22 disposed over the IDT electrodes in their center region C, may be less effective than desirable in suppressing transverse mode spurious signals that may interfere with operation of the SAW resonator. FIG. 3A illustrates the strength of transverse mode spurious signals generated in a SAW resonator utilizing IDT electrodes with a Mo layer and a silicon nitride layer thickness of 0.005 k, where $\lambda$ represents the wavelength of the main acoustic wave generated in the resonator. In comparison, FIG. 3B illustrates the strength of transverse mode spurious signals generated in a similar SAW resonator utilizing IDT electrodes with a W layer and various silicon nitride layer thickness. It can be seen that even if the thickness of the silicon nitride layer is more than doubled in the SAW resonator utilizing the IDT electrodes with the W layer as compared to that of the SAW resonator utilizing the IDT electrodes with the Mo layer, the transverse mode spurious signals generated in the SAW resonator utilizing the IDT electrodes with the W layer are significantly stronger than the transverse mode spurious signals generated in the SAW resonator utilizing the IDT electrodes with the Mo layer.

To suppress high-order transverse mode spurious signals when W is used in the IDT electrodes of a SAW resonator, it was found that the problem can be solved by reducing the acoustic velocity in the edge region and increasing the SAW velocity difference between the center region and the edge region.

Figure 4:
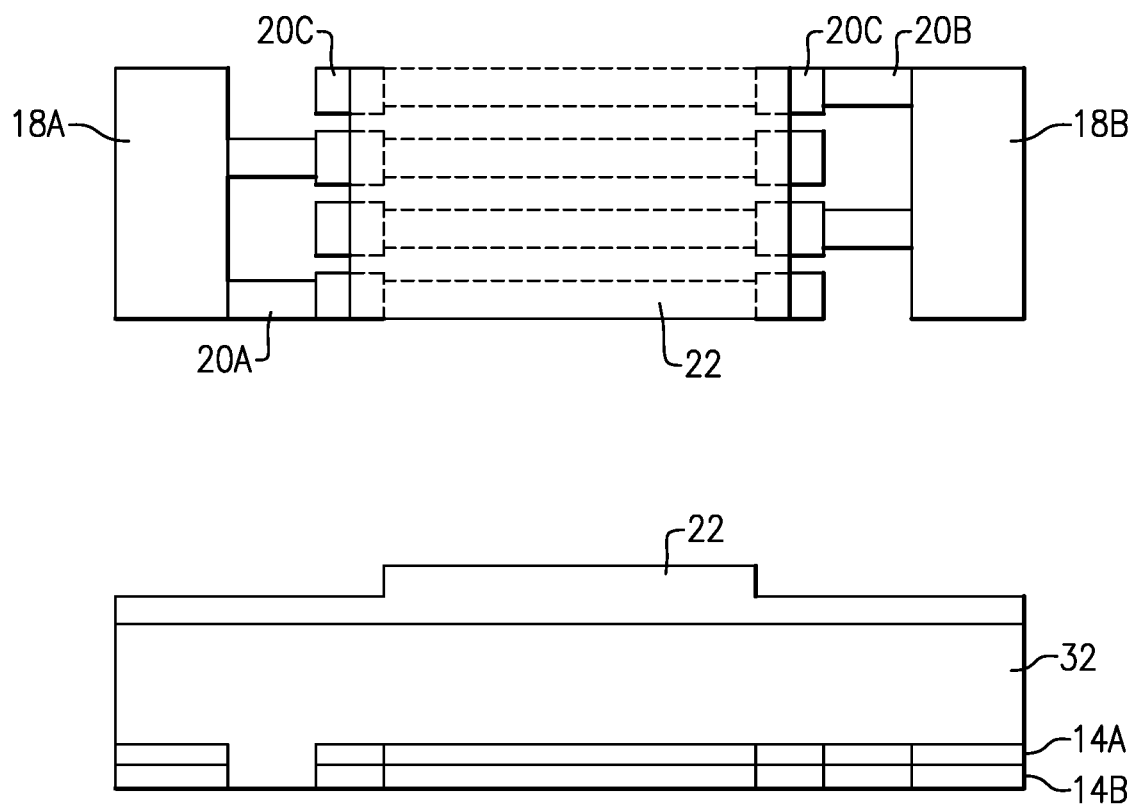
FIG. 4 illustrates a portion of an example of a SAW resonator with thickened IDT electrodes in edge regions of the SAW resonator.
Figure 5:
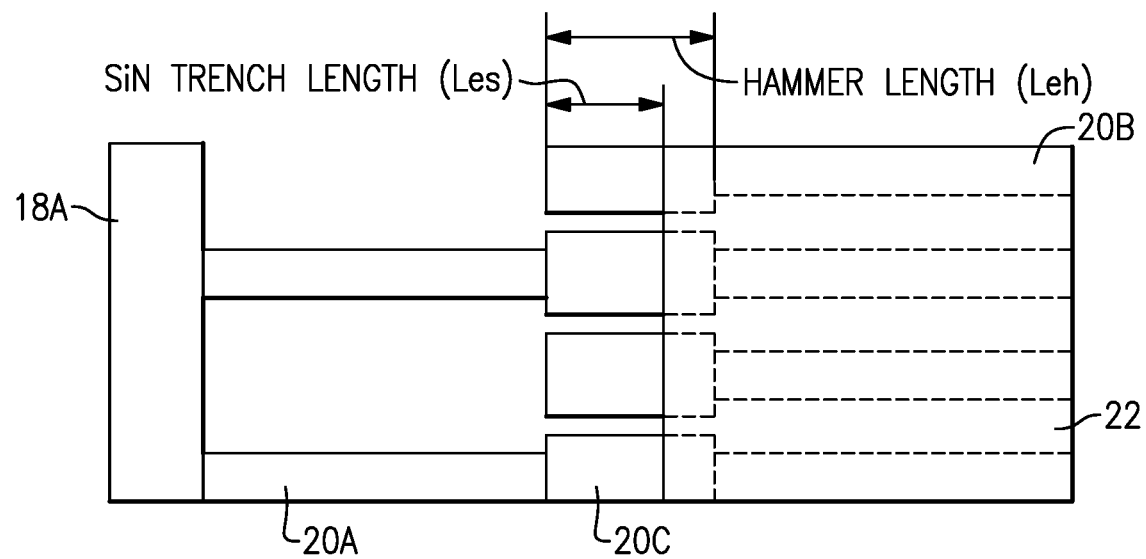
FIG. 5 is an enlarged view of a portion of FIG. 4.

One method of reducing the acoustic velocity in the edge region of a SAW resonator may be to include additional material, for example, by increasing the width or duty factor of the IDT electrodes in the edge regions of the SAW resonator. FIGS. 4 and 5 illustrate one example of a SAW resonator including thickened portions 20C of the IDT electrodes in the edge regions of the resonator. The resonator may include the layer of high acoustic wave velocity material 22 over the IDT electrodes in the center region of the resonator. A layer of dielectric material 32 may be disposed between the layer of high acoustic wave velocity material 22 and the substrate and IDT electrodes of the SAW resonator. The thickened regions of the IDT electrodes 20C may be referred to herein as "hammers." The layer of high acoustic wave velocity material 22 may be at least partially disposed over the IDT electrode hammers 20C. As indicated in FIG. 5, the length along the IDT electrode hammers 20C not covered by the layer of high acoustic wave velocity material 22 is referred to herein as the SiN Trench Length (Les). The SiN Trench Length Les may be greater than the total length of the IDT electrode hammers 20C if the SiN does not cover the entire center region but has edges that terminate in the center region of the resonator and do not extend over the IDT electrode hammers 20C. In such embodiments Les is defined as the length from the outside edges of the electrode hammers 20C to the outside edges of the SiN layer. The entire length of the IDT electrode hammers 20C is referred to herein as the Hammer Length (Leh). In some embodiments Les is different from Leh and in some embodiments Leh is greater than Les.

The IDT electrode hammers 20C in the edge regions of the resonator may be in the form of rectangles of the same material or materials from which the IDT electrodes are formed that are thickened in a width direction perpendicular to the lengthwise direction of the IDT electrodes. The IDT electrode hammers 20C, however, are not limited to being rectangular, and in other embodiments may be square, oval, circular, or may have any other shape desired. The IDT electrode hammers 20C are illustrated as being widthwise symmetric relative to the non-thickened portions of the IDT electrodes 20A, 20B. In other embodiments, the IDT electrode hammers 20C may extend widthwise further from one side of the IDT electrodes than the opposite side of the IDT electrodes. Unless specified otherwise, as the term is used herein, a width direction is in a direction parallel to the direction of propagation of the main acoustic wave through the SAW resonator. Unless specified otherwise, as the term is used herein, a lengthwise direction is perpendicular to the direction of propagation of the main acoustic wave through the SAW resonator.

Figure 6A:
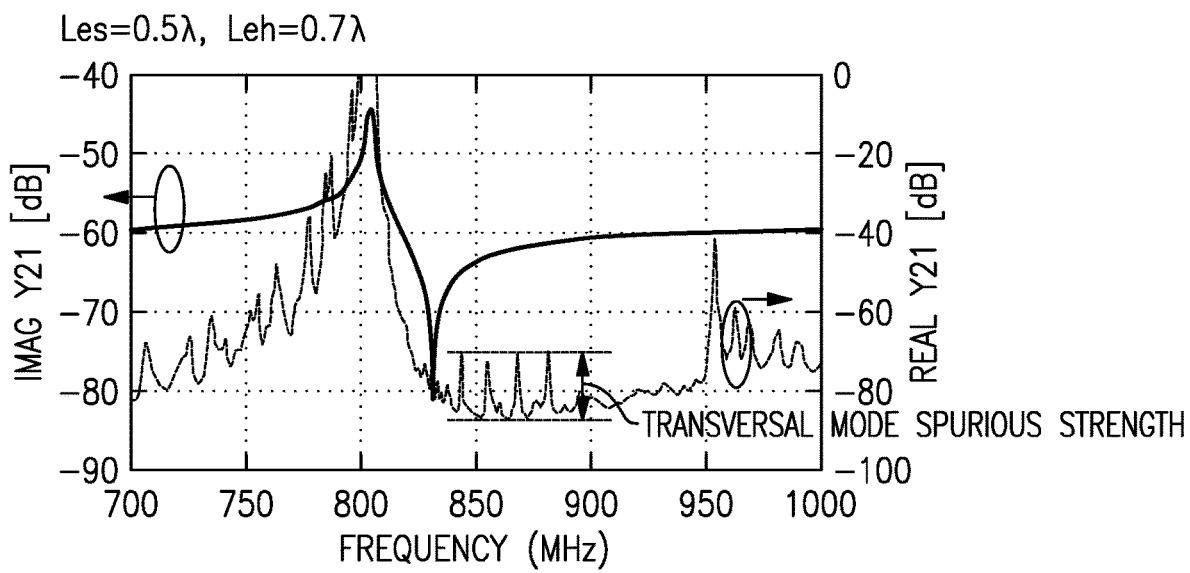
FIGS. 6A-6W illustrate admittance curves of examples of SAW resonators disclosed herein.
Figure 6B:
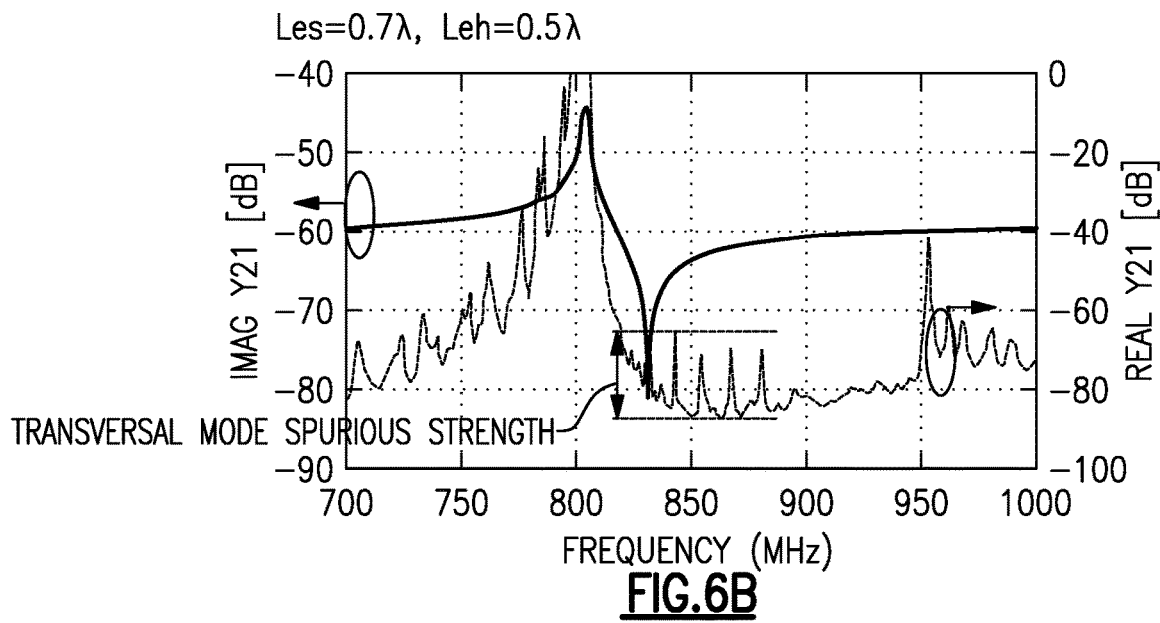
FIG. 6X illustrates strength of transverse mode spurious signals in SAW resonators as disclosed herein as a function of length of a thickened edge regions of interdigital transducer (IDT) electrodes in the SAW resonators.
FIG. 6Y illustrates strength of transverse mode spurious signals in SAW resonators as disclosed herein as a function of length of a silicon nitride (SiN) layer disposed above the thickened edge regions of the interdigital transducer (IDT) electrodes in the SAW resonators.

It has been found that in some embodiments, setting Les smaller than Leh may result in a greater degree of suppression of transverse mode spurious signals in SAW resonators than if Les is set greater than Leh. This is illustrated in FIGS. 6A and 6B which illustrate admittance curves for resonators including IDT electrode hammers 20C as disclosed herein. In FIG. 6A Les is set at 0.5 $\lambda$ and Leh is set at 0.7 $\lambda$. In FIG. 6B Les is set at 0.7 $\lambda$ and Leh is set at 0.5 $\lambda$. It can be observed that the strength of the transverse mode spurious signals is less in FIG. 6A than in FIG. 6B.

Figure 6C:
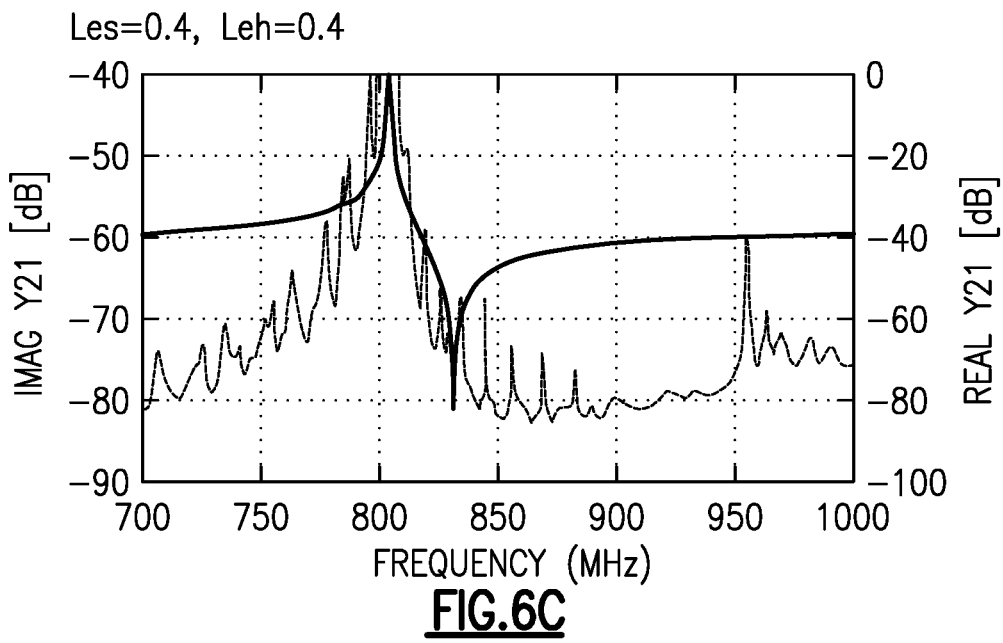
Figure 6D:
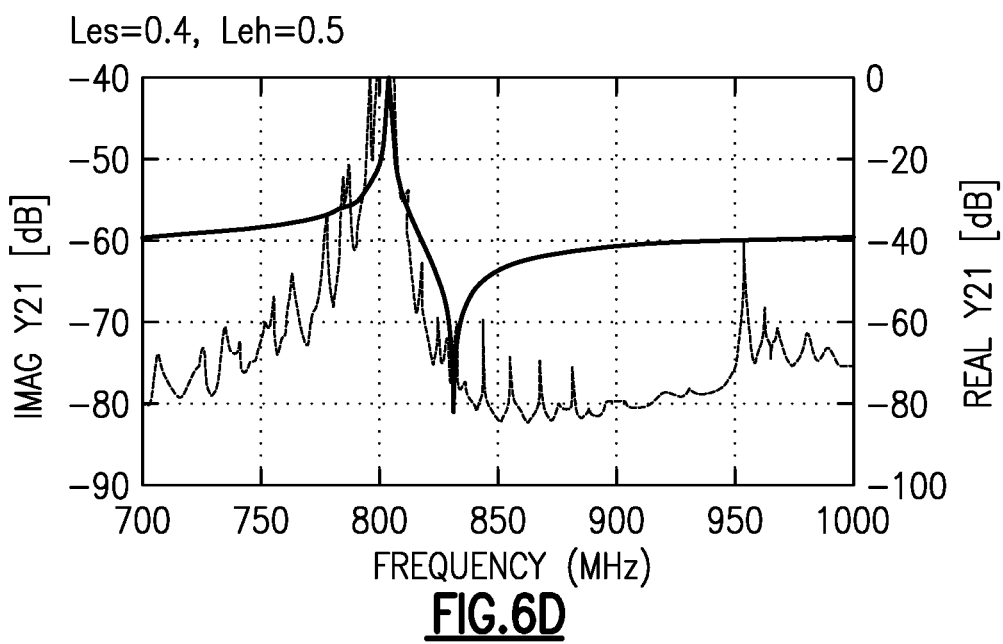
Figure 6E:
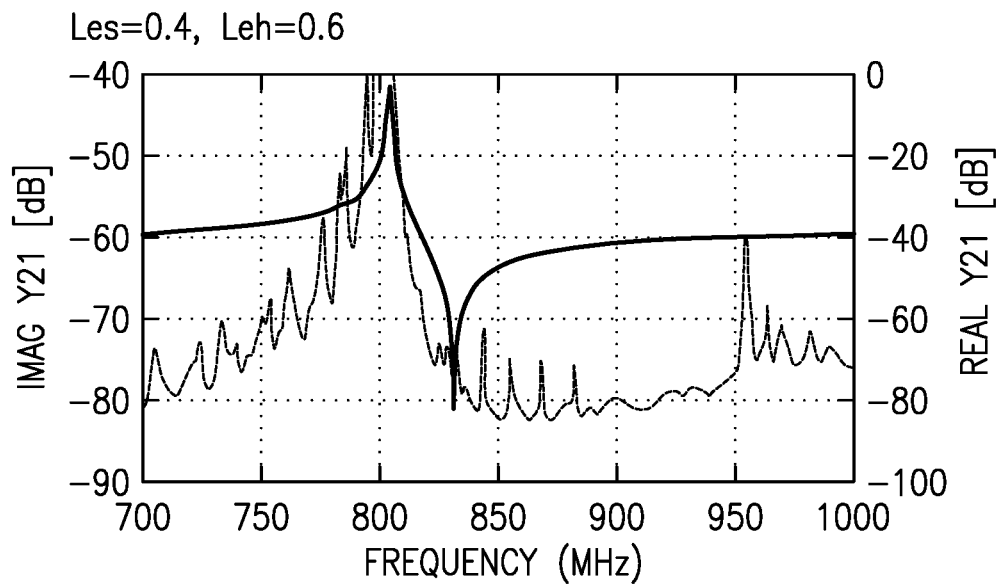
Figure 6F:
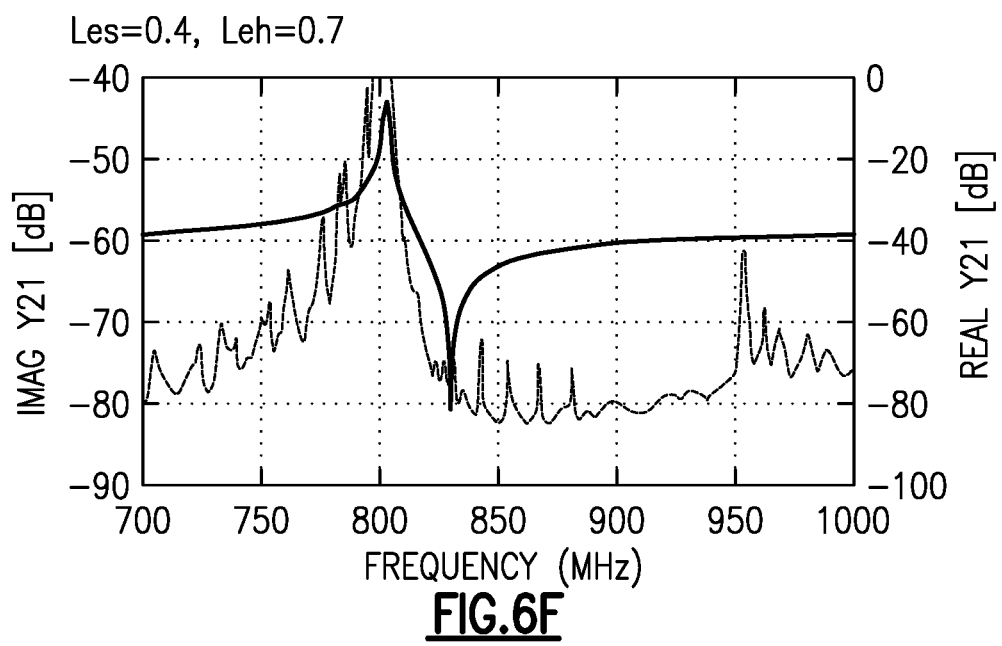
Figure 6G:
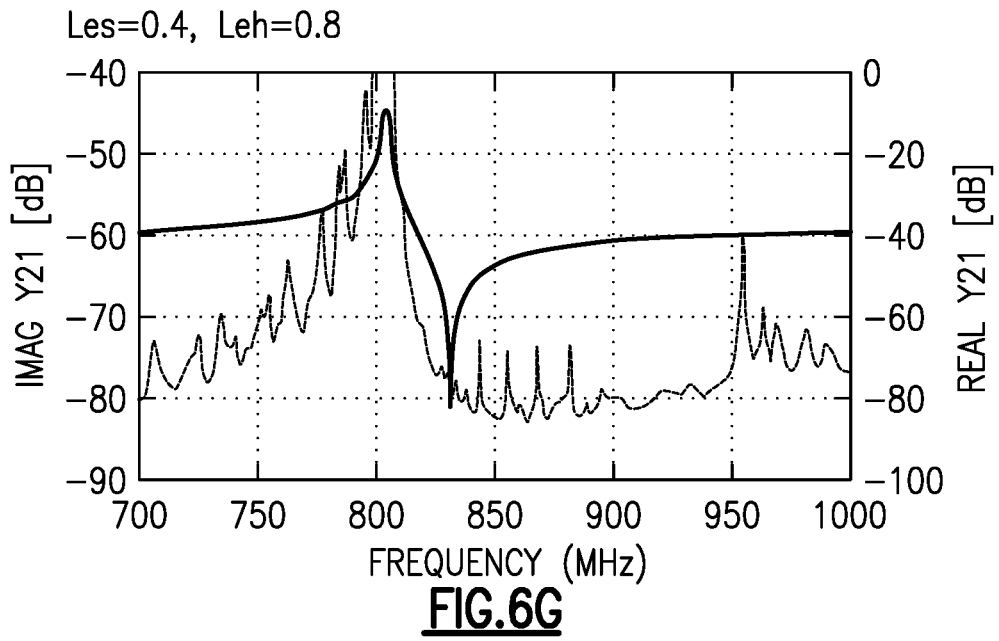
Figure 6H:
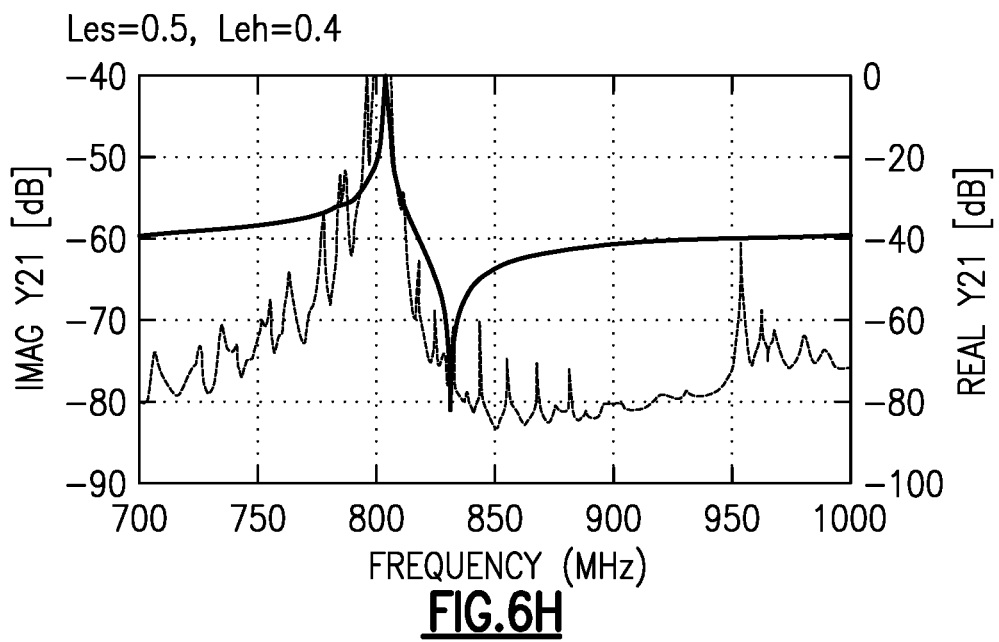
Figure 6I:
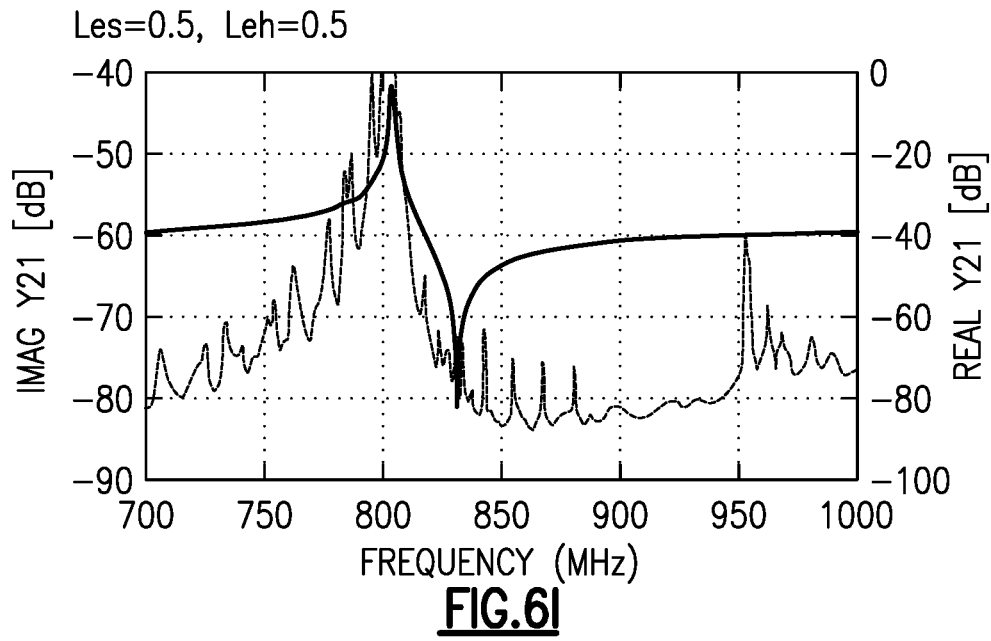
Figure 6J:
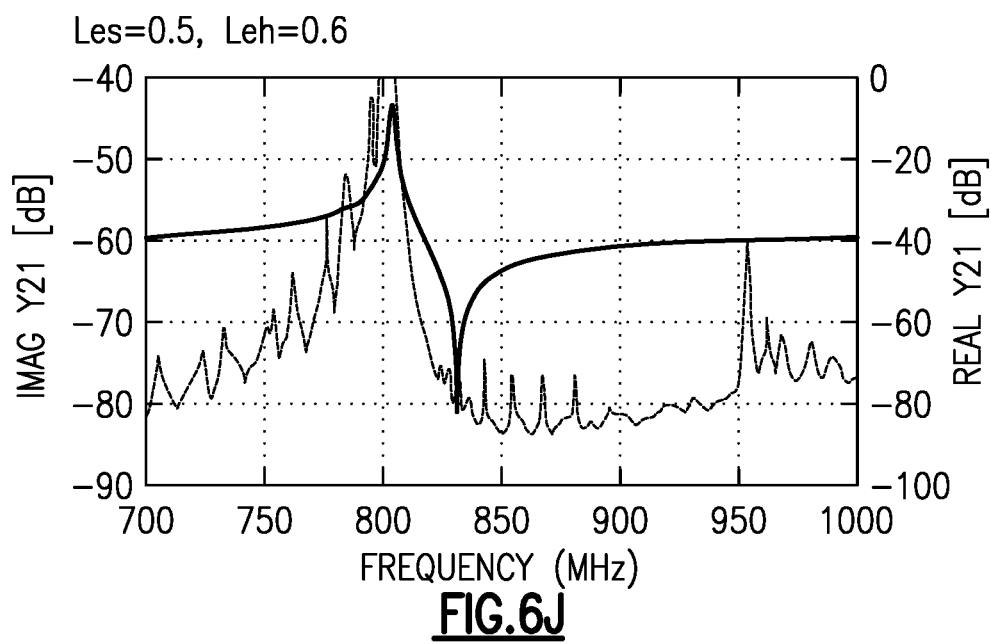
Figure 6K:
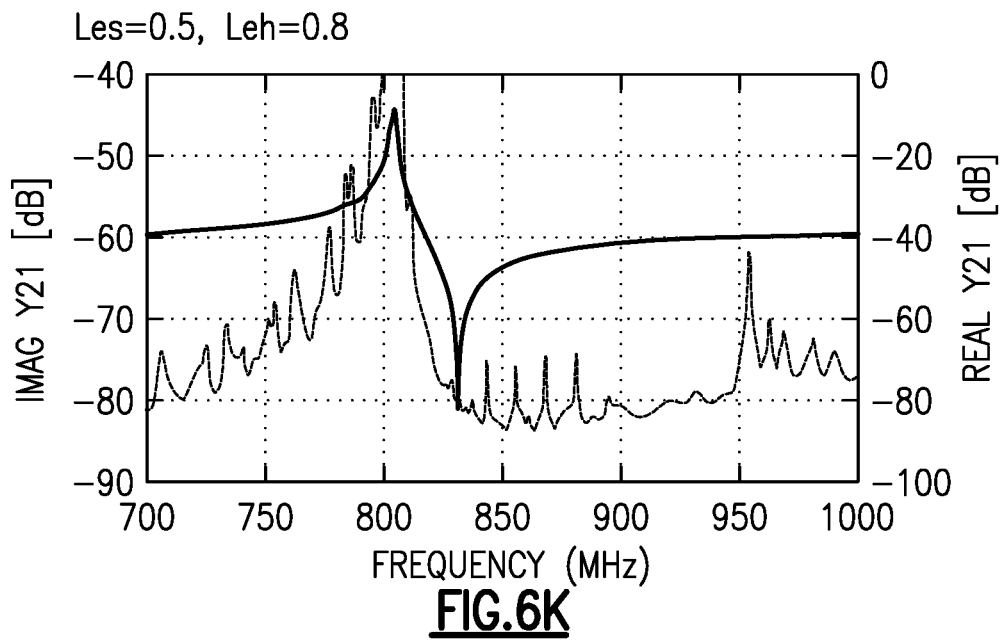
Figure 6L:
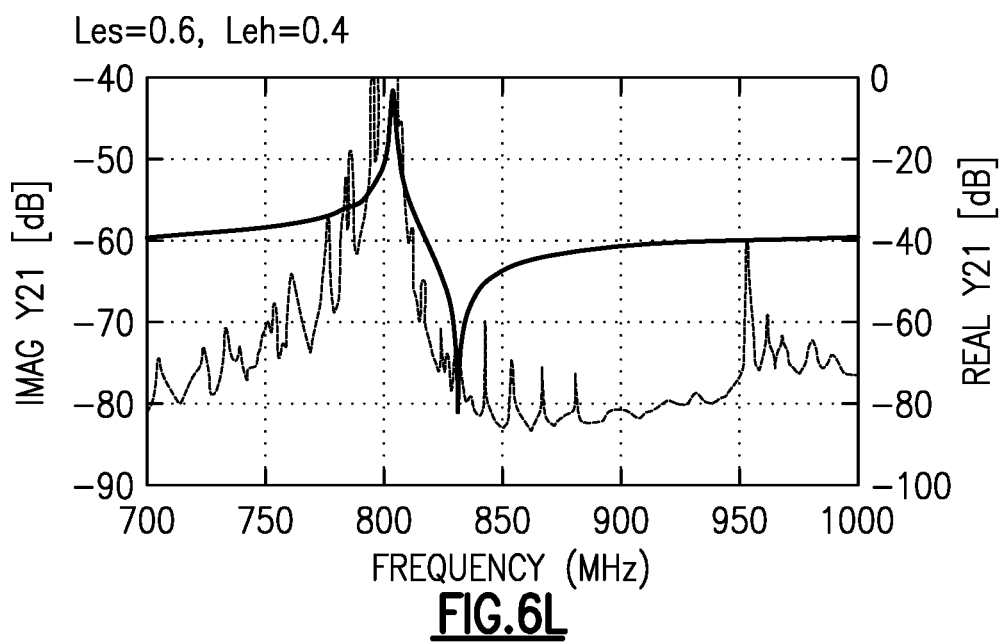
Figure 6M:
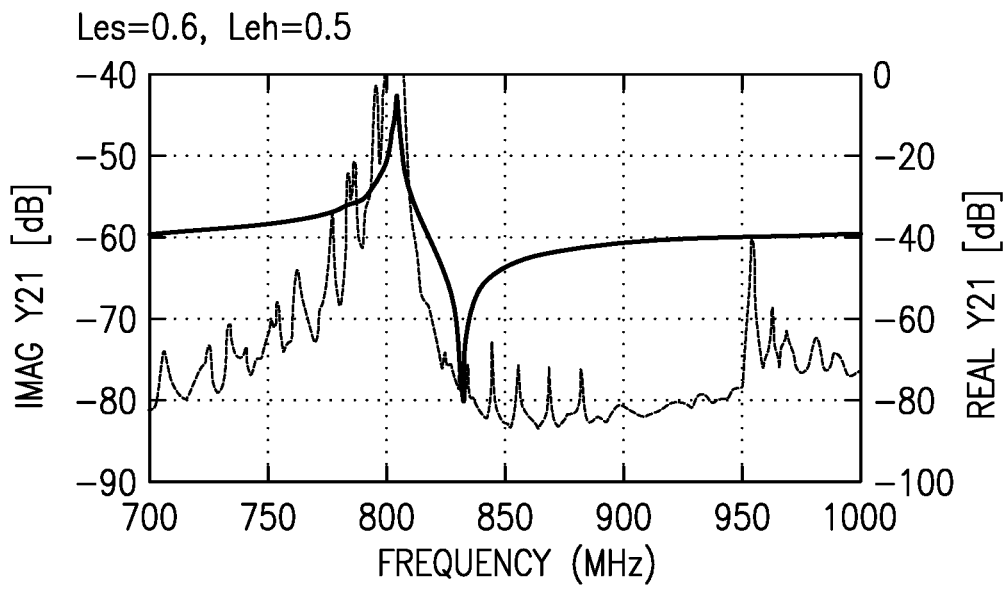
Figure 6N:
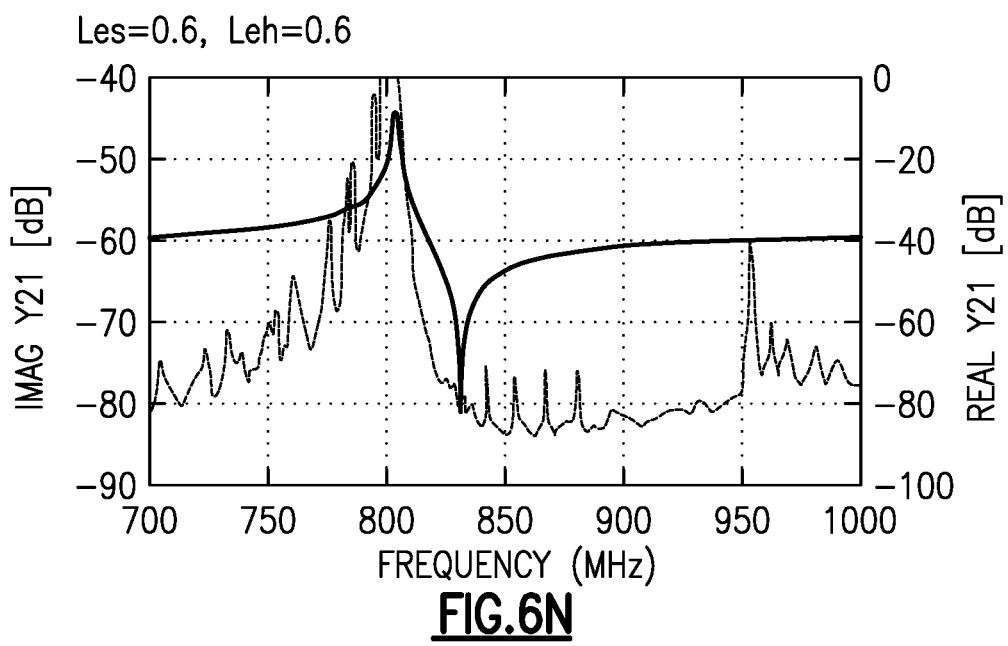
Figure 6O:
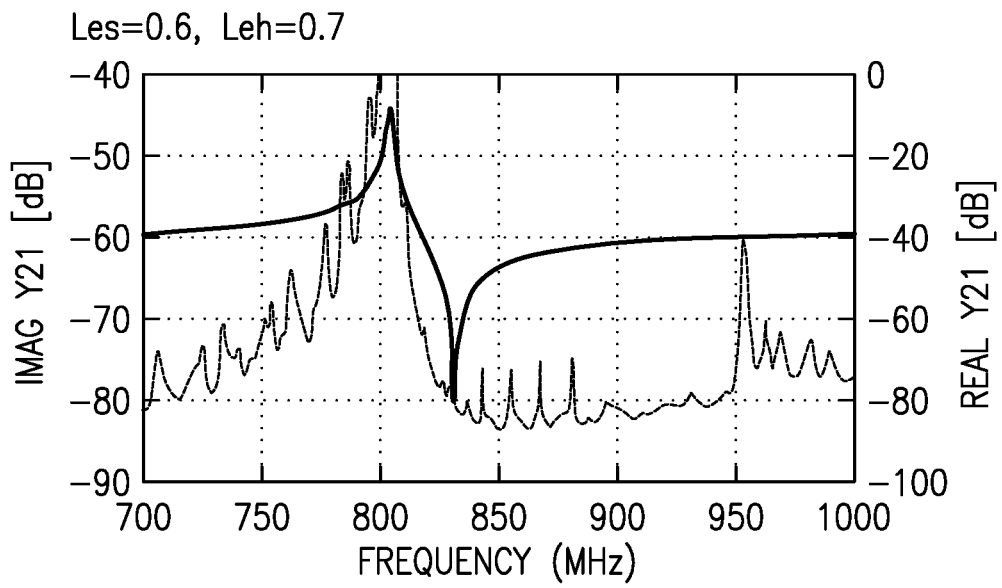
Figure 6P:
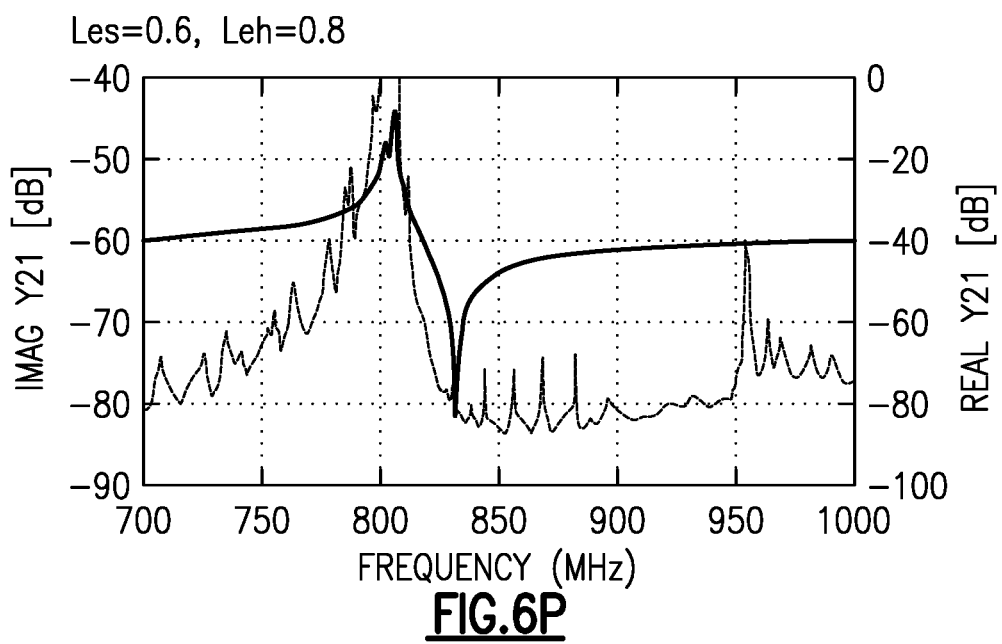
Figure 6Q:
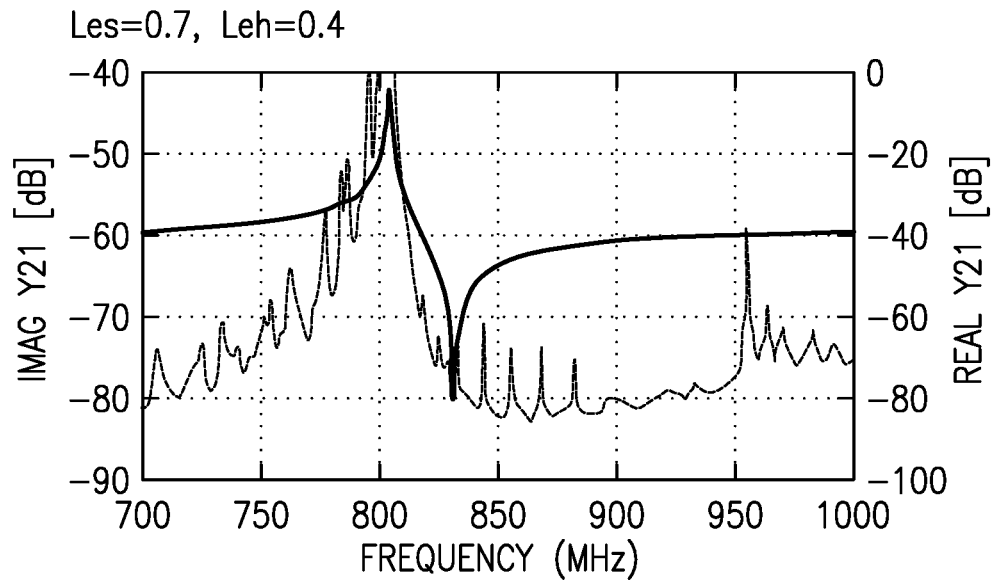
Figure 6R:
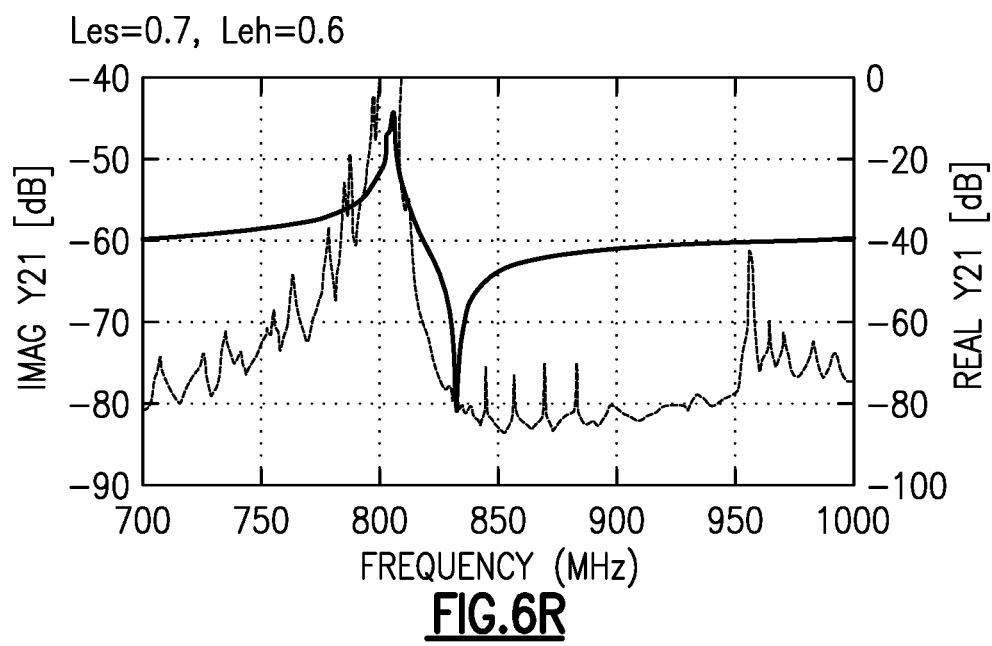
Figure 6S:
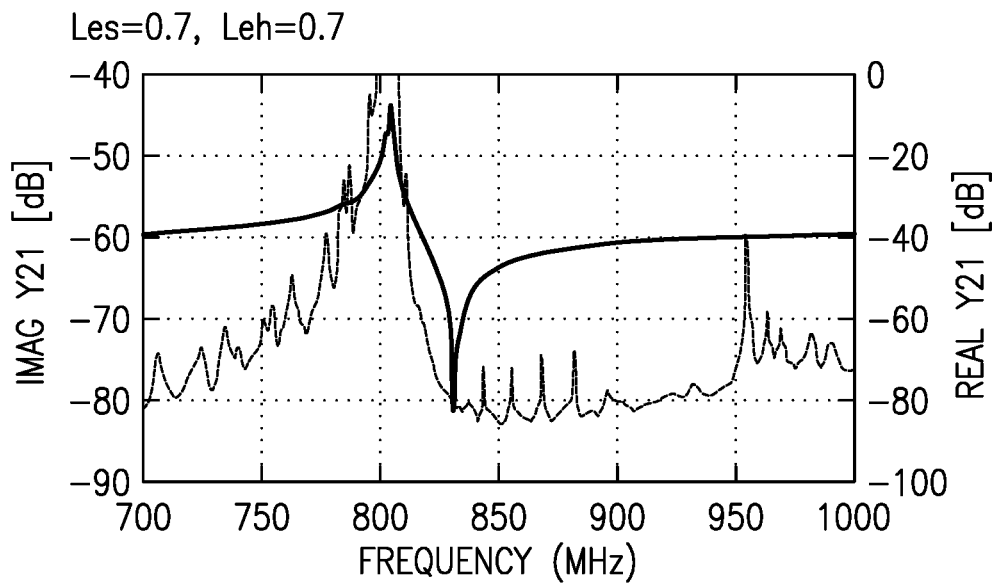
Figure 6T:
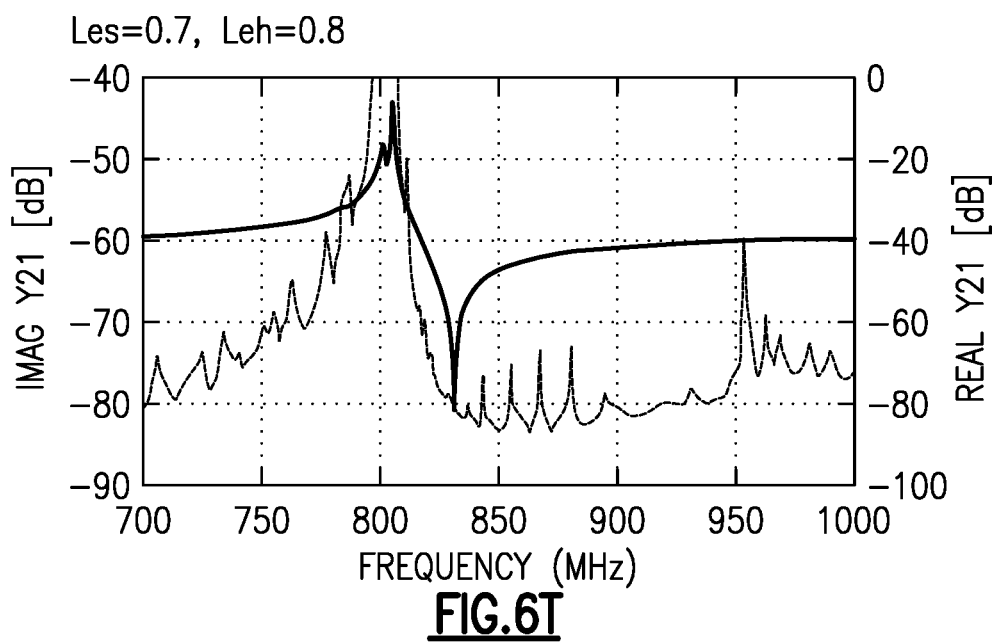
Figure 6U:
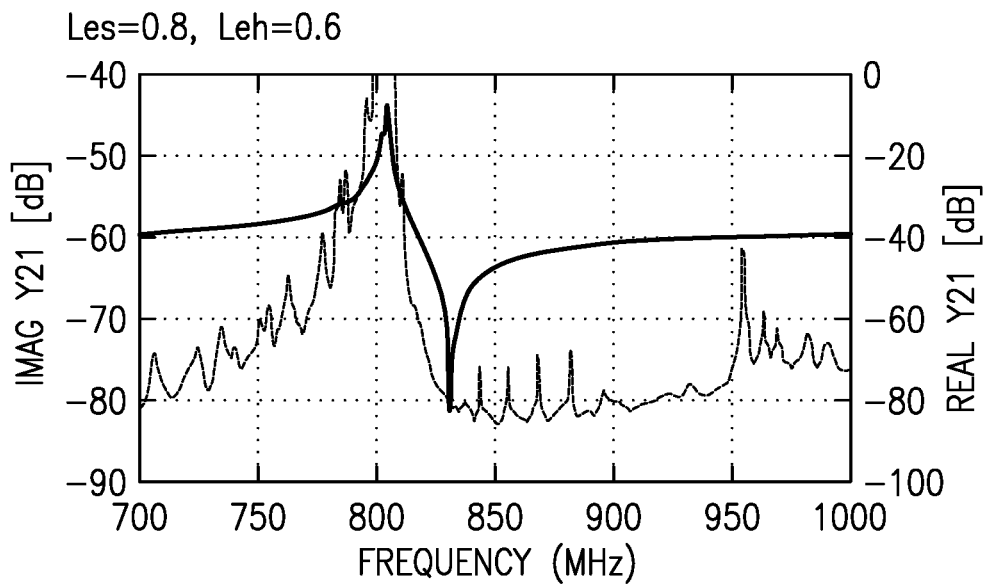
Figure 6V:
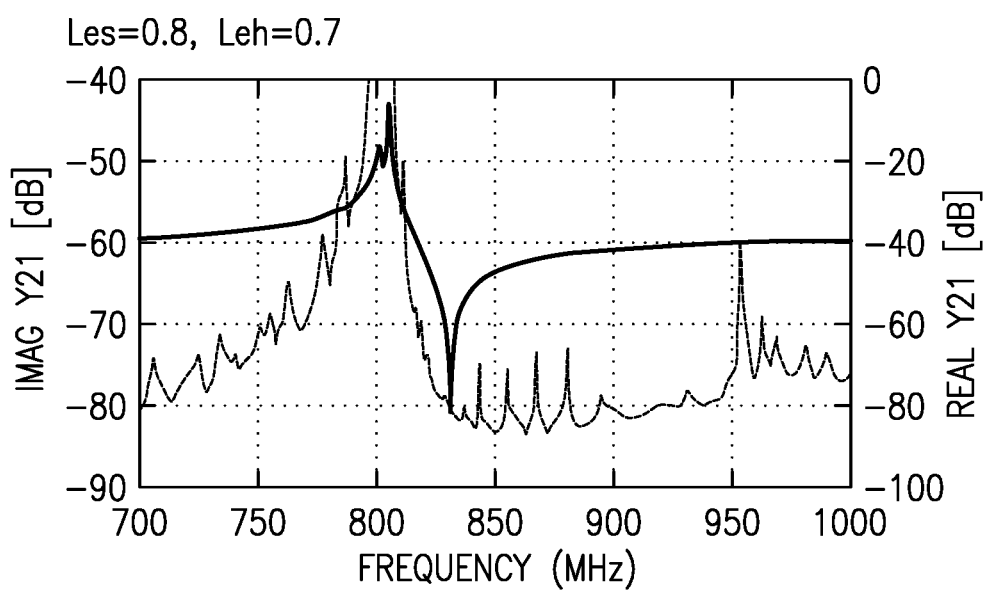
Figure 6W:
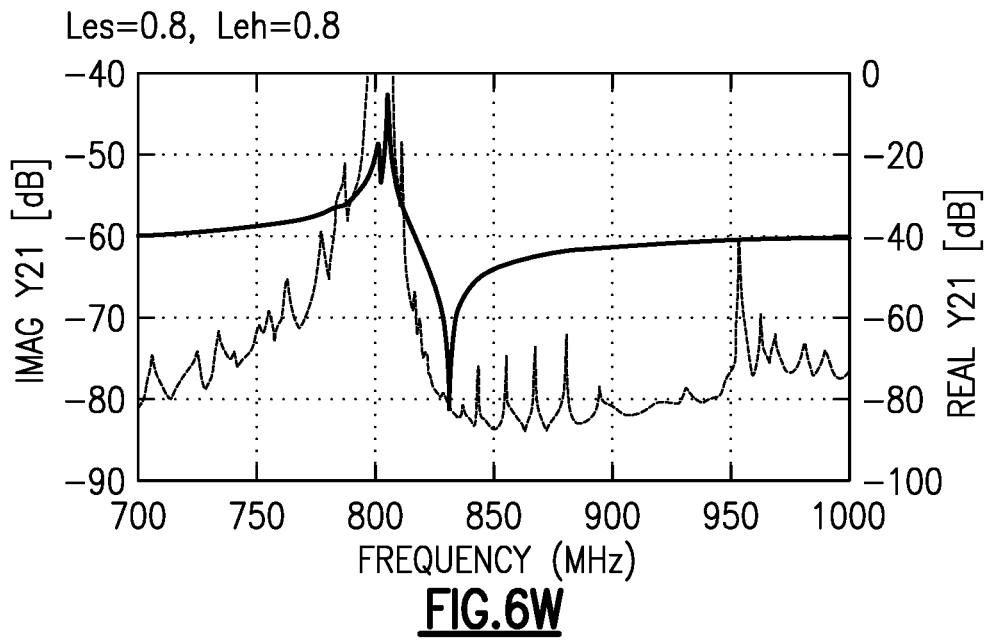
Figure 6X:
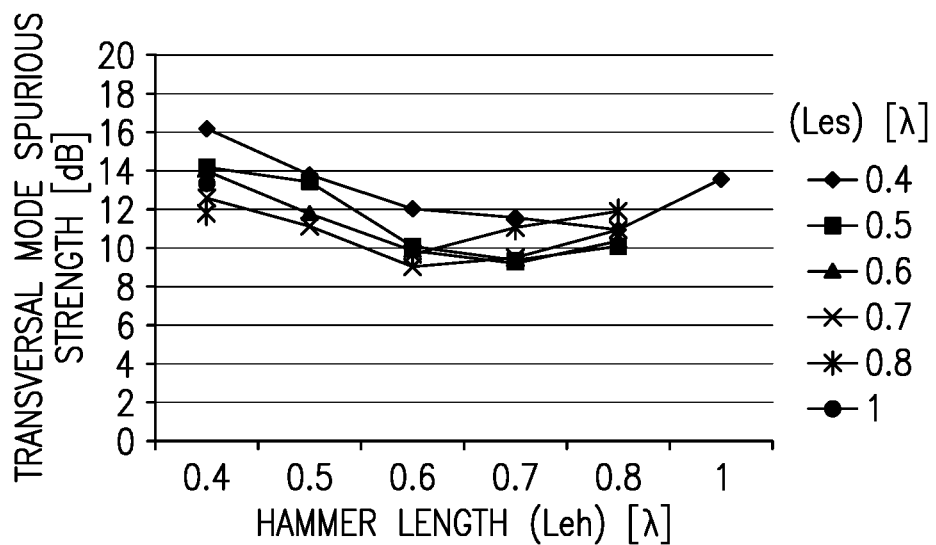
Figure 6Y:
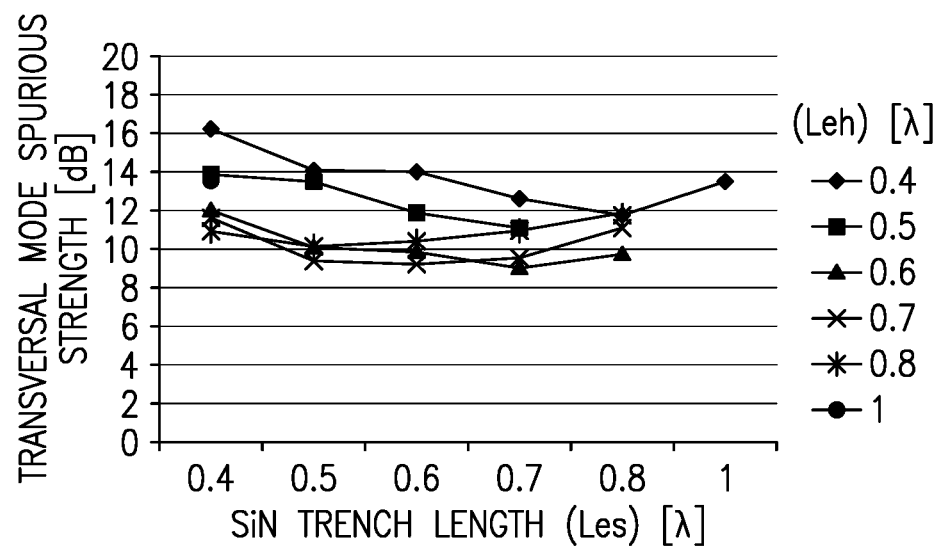

FIGS. 6C-6W illustrate admittance curves for resonators including IDT electrode hammers 20C as disclosed herein with different hammer lengths Leh and SiN trench lengths Les. In each of FIGS. 6C-6W, the resonator was modeled with a W electrode layer thickness of 330 nm, a $\lambda$ of 4.0 $\lambda$m, an aperture (length between outside edges of edge regions) of 20 $\lambda$, a center region electrode duty factor of 0.45, an electrode hammer duty factor of 0.575, a SiN layer thickness of 60 nm, and a SiN trench depth of 5 nm. In FIGS. 6C-6W Leh and Les are expressed as a fraction of k. In comparing FIGS. 6C-6W, it can be observed that the strength of the transverse mode spurious signals generally decreases with both increasing hammer length Leh and increasing SiN trench width Les. These trends are illustrated in FIGS. 6X and 6Y. One combination of Les and Leh that provides a particularly good suppression of transverse mode spurious signals is Les=0.5 $\lambda$ and Leh=0.7 $\lambda$.

Figure 7A:
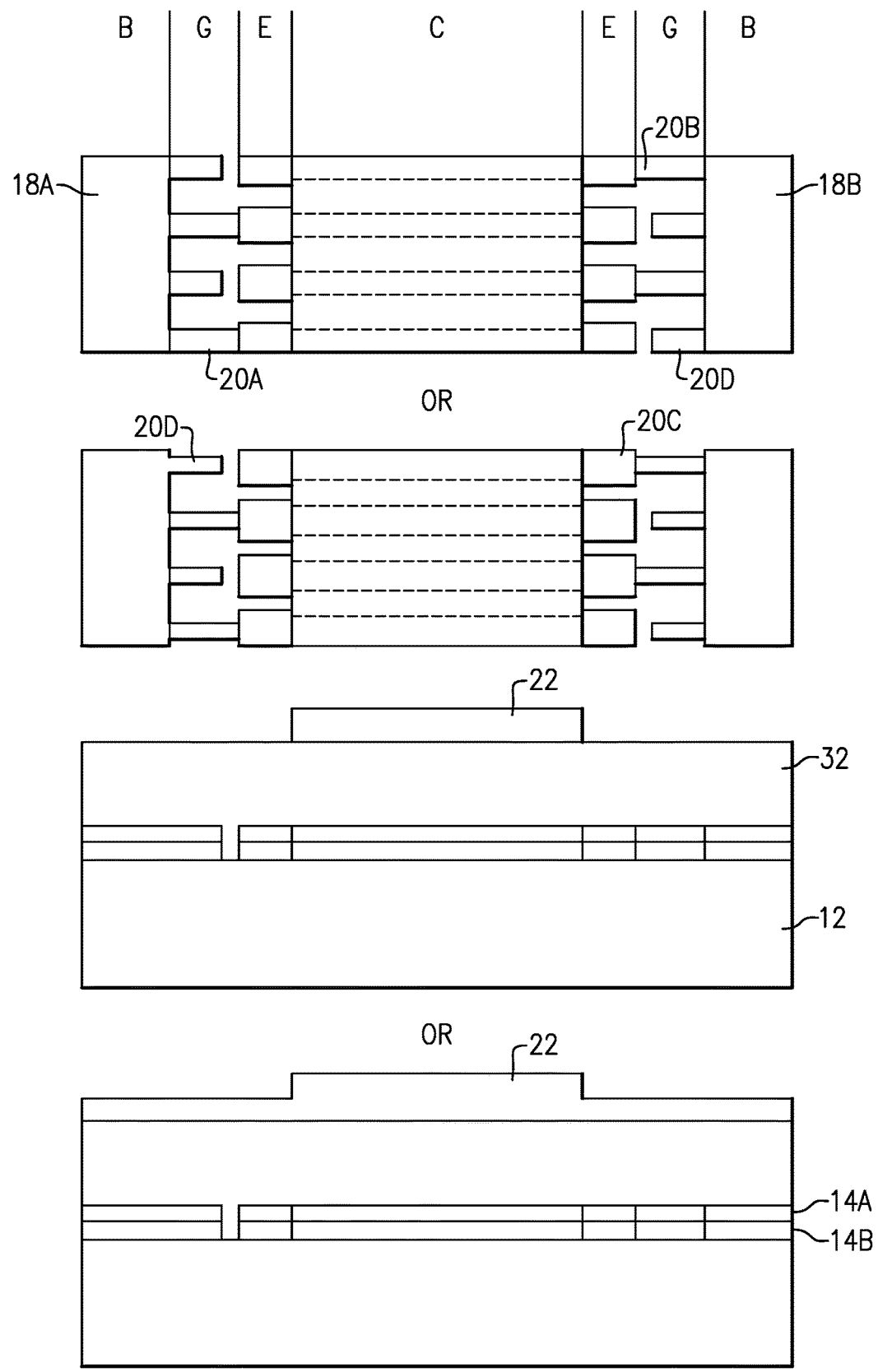
FIG. 7A illustrates portions of examples of SAW resonators including dummy IDT electrodes in a gap regions and IDT electrodes with thickened portions in edge regions.
Figure 7B:
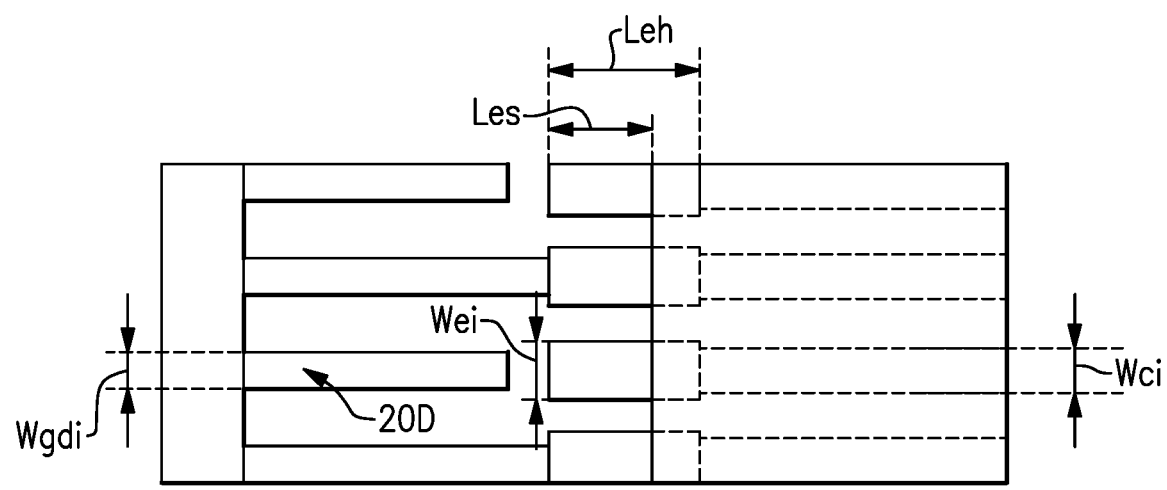
FIG. 7B illustrates relative dimensions of the dummy IDT electrodes and IDT electrodes having thickened portions in the edge regions of the examples of SAW resonators of FIG. 7A.

In some embodiments, dummy electrode fingers 20D may be provided in the SAW resonators disclosed herein. The dummy electrode fingers 20D are present in the gap region in the IDT electrode structure of the SAW resonators, and may be aligned with the electrode fingers 20A, 20B, but extending from opposite bus bars than the respective electrode fingers 20A, 20B. Examples of portions of IDT electrode structures for SAW resonators as disclosed herein and including dummy electrode fingers 20D are illustrated in FIGS. 7A and 7B. As noted in FIG. 7B, the width of the dummy electrode fingers 20D may be less than the width of the IDT electrode hammers 20C (also referred to as edge region IDTs) and may be less than the width of the IDT electrodes in the center region of the device.

Figure 8A:
FIG. 8A illustrates a SAW resonator structure utilized in simulations to determine the effect of changes in dummy IDT electrode width on electrical parameters of the resonator.
Figure 8A:
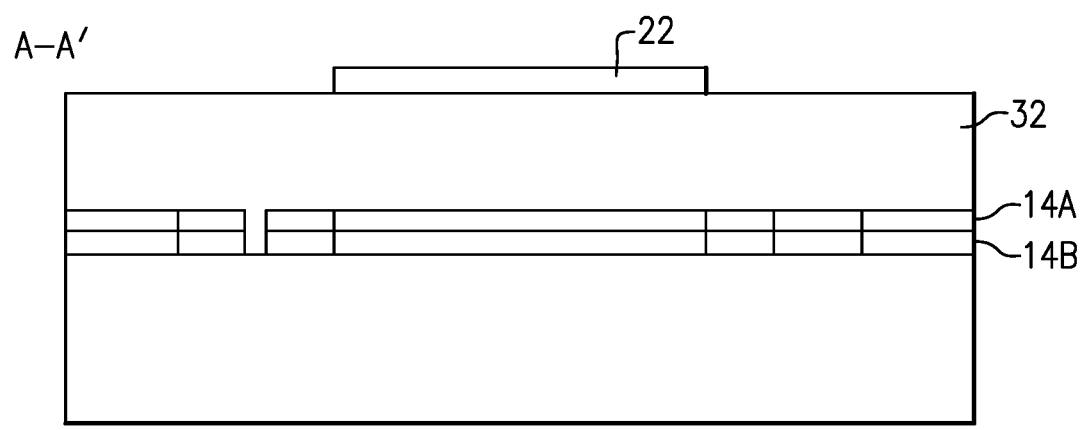
Figure 8A:
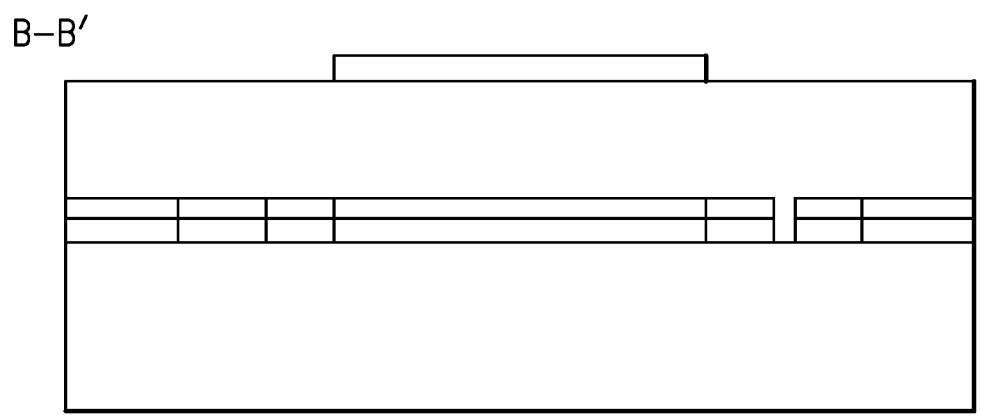
Figure 8B:
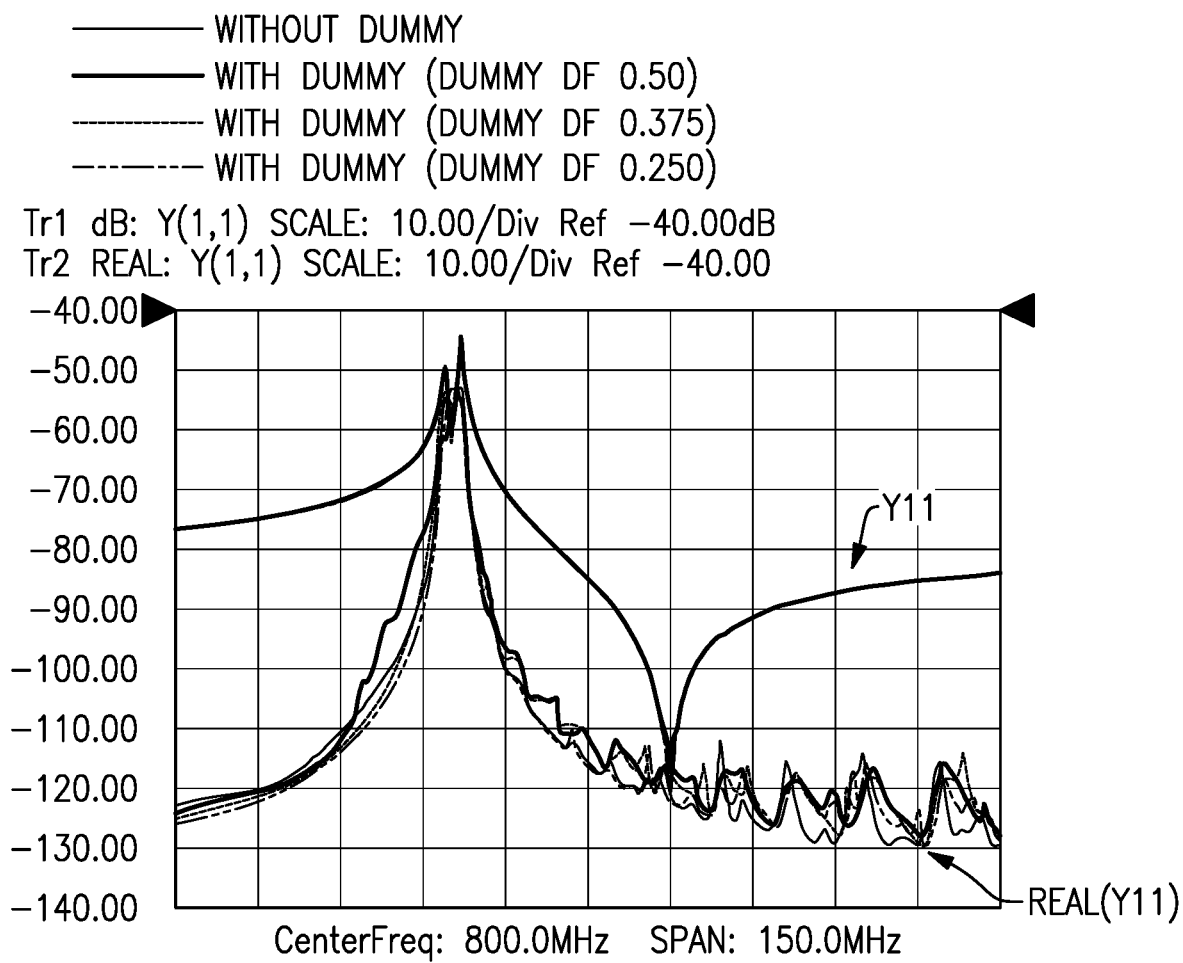
FIG. 8B illustrates the effect of changes in dummy IDT electrode width on the admittance curve of the SAW resonator of FIG. 8A.
Figure 8C:
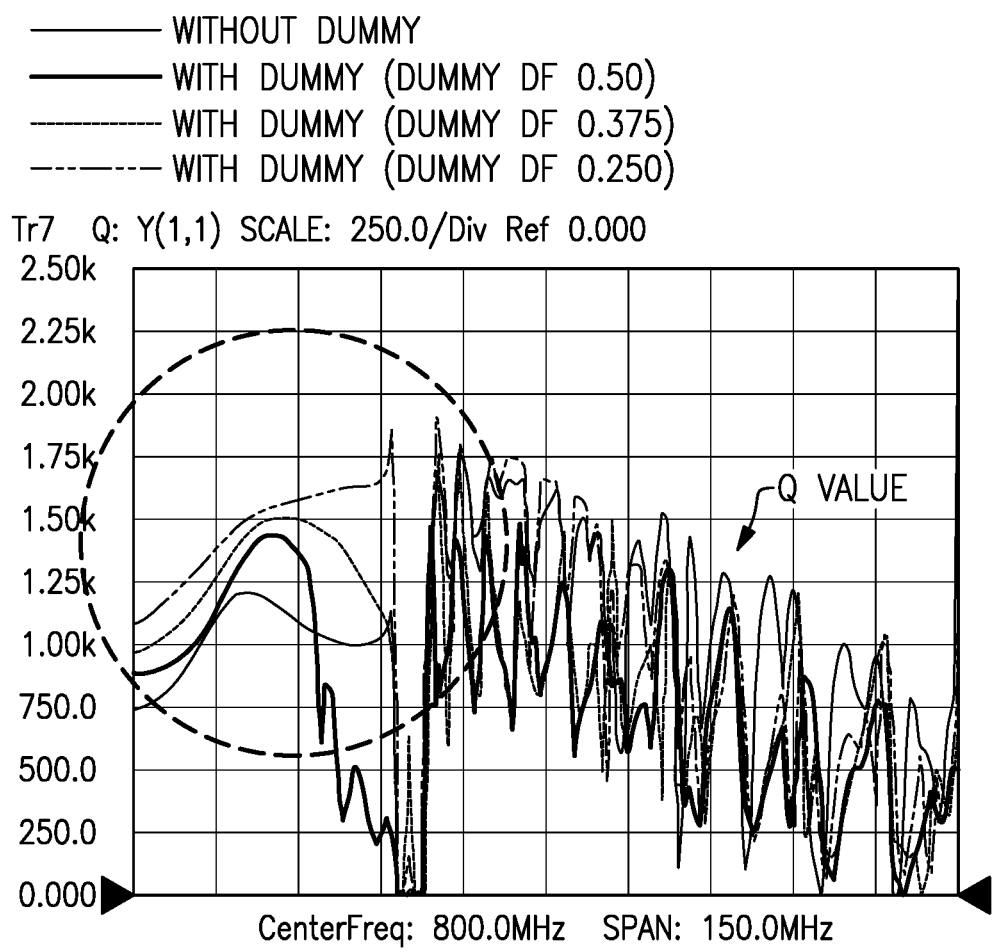
FIG. 8C illustrates the effect of changes in dummy IDT electrode width on the quality factor Q of the SAW resonator of FIG. 8A.

Simulations were performed on a SAW resonator as illustrated in part in FIG. 8A without dummy electrode fingers 20D and with dummy electrode fingers 20D having duty factors of 0.50, 0.375, and 0.250. The results of these simulations are illustrated in FIGS. 8B and 8C. From these results it can be seen that the Q value of the resonator is improved when the resonator has thin dummy electrode fingers 20D, e.g., with a duty factor of 0.25 as compared to resonators having thicker dummy electrode fingers or without dummy electrode fingers.

Figure 9A:
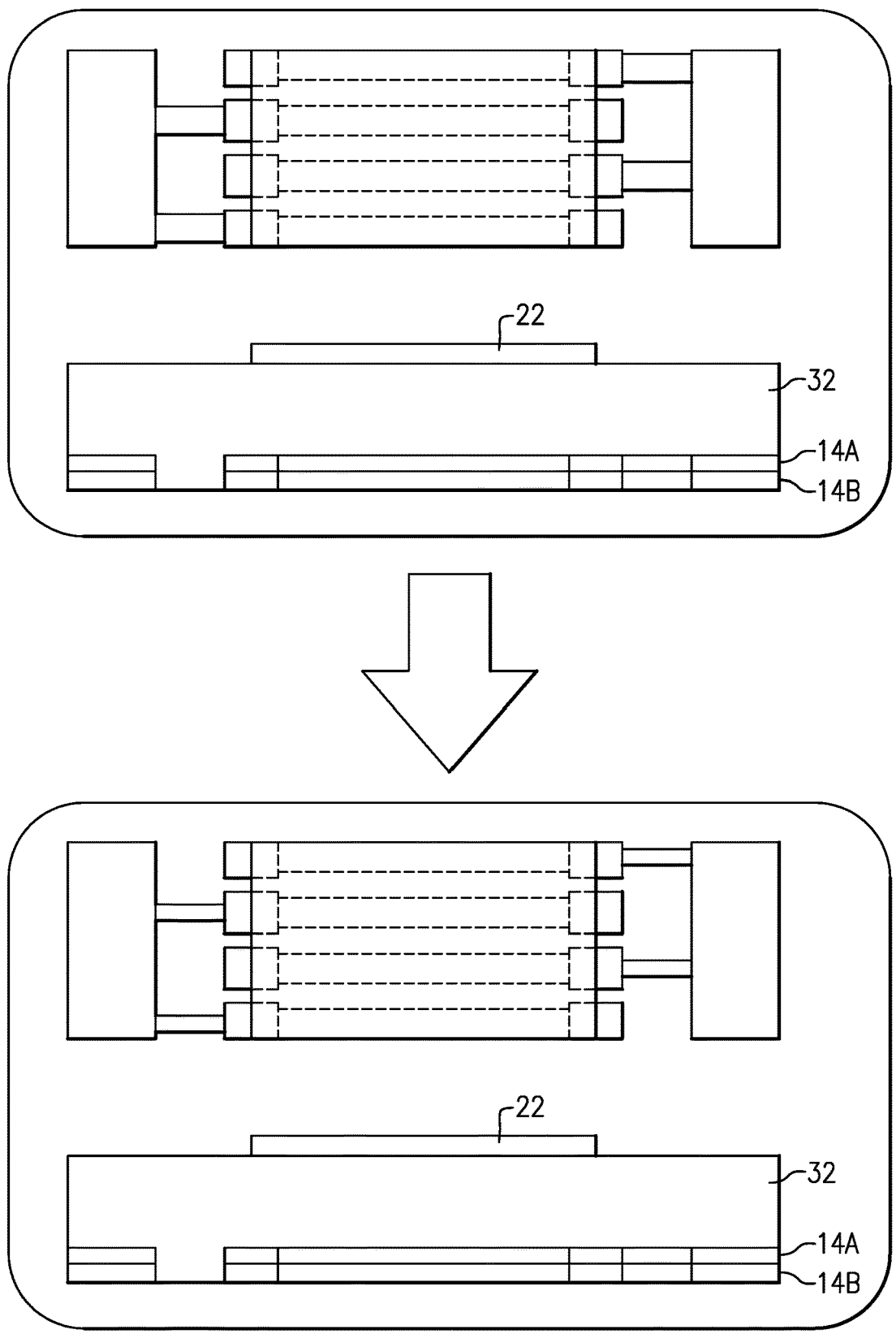
FIG. 9A illustrates a modification to a SAW resonator to include reduced width IDT electrodes in the gap regions of the resonator.
Figure 9B:
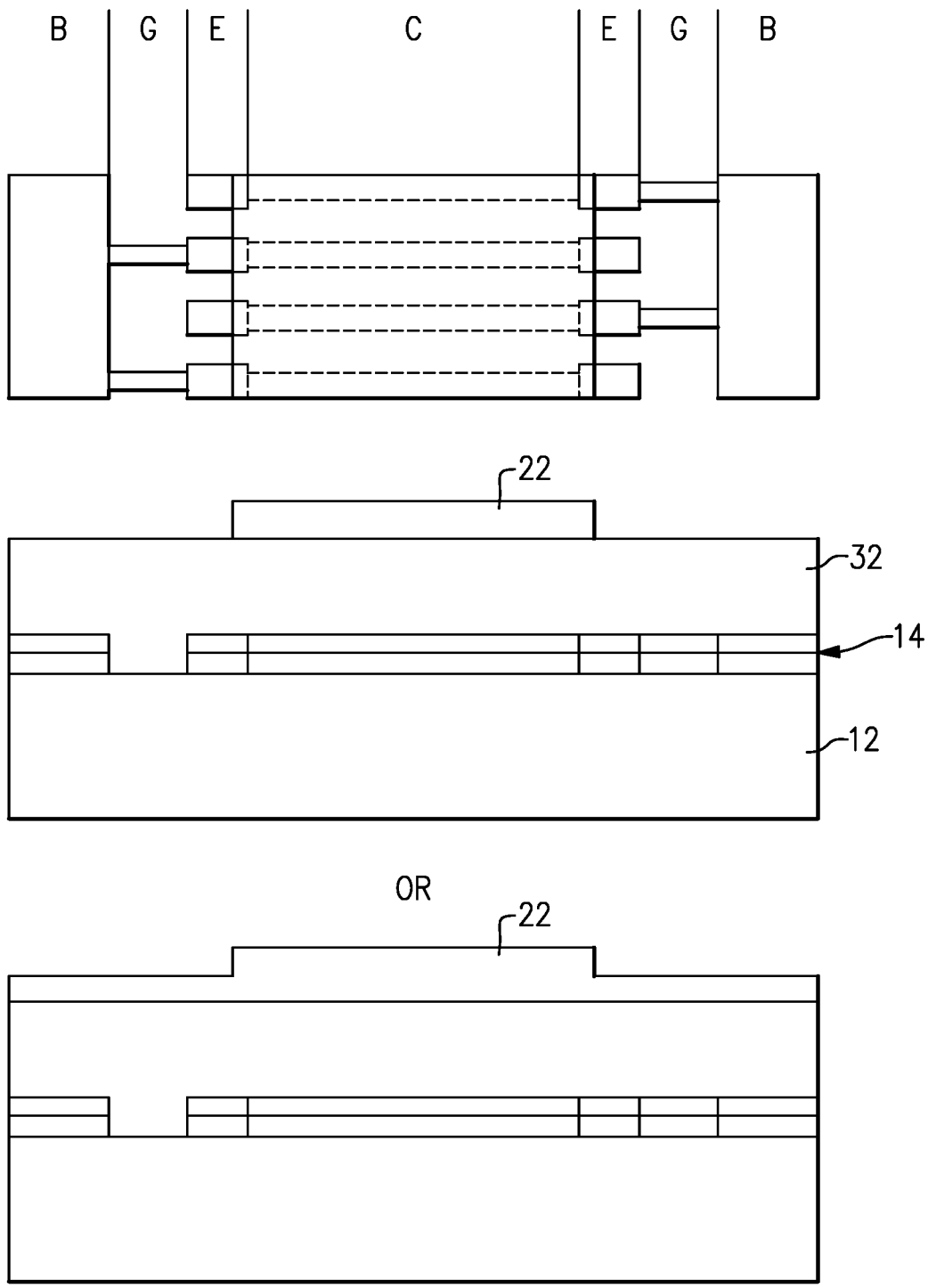
FIG. 9B illustrates examples of SAW resonators including IDT electrodes with portions having reduced widths in the gap regions.
Figure 9C:
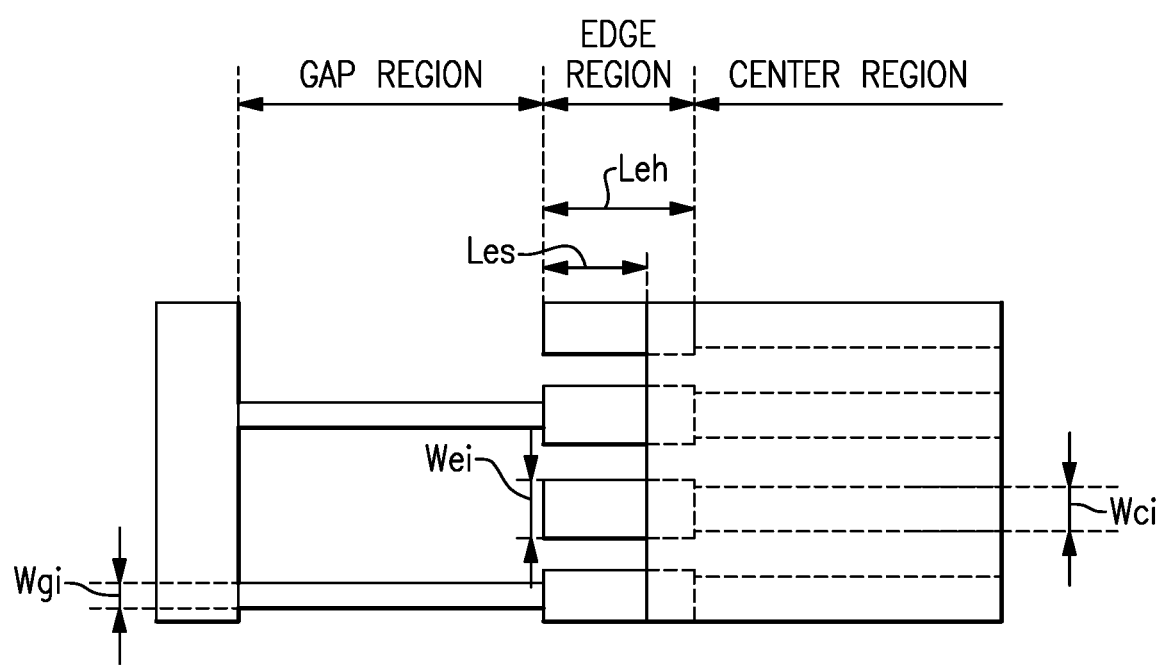
FIG. 9C illustrates relative dimensions of portions of the IDT electrodes of the SAW resonators of FIGS. 9A and 9B.

It has been discovered that even without including dummy electrode fingers in a SAW resonator including IDT electrode hammers as disclosed herein, the Q factor of the resonators may be increased by reducing the width of the IDT electrodes in the gap regions of the resonator as illustrated in FIGS. 9A-9C. The width of the IDT electrodes in the gap region may be less than the width of the IDT electrode hammers and may be less than the width of the IDT electrodes in the center region of the device. The width of the IDT electrodes in the gap region may be, for example, between about 0.40 and about 0.80 times the width of the IDT electrode in the center regions.

Figure 9D:
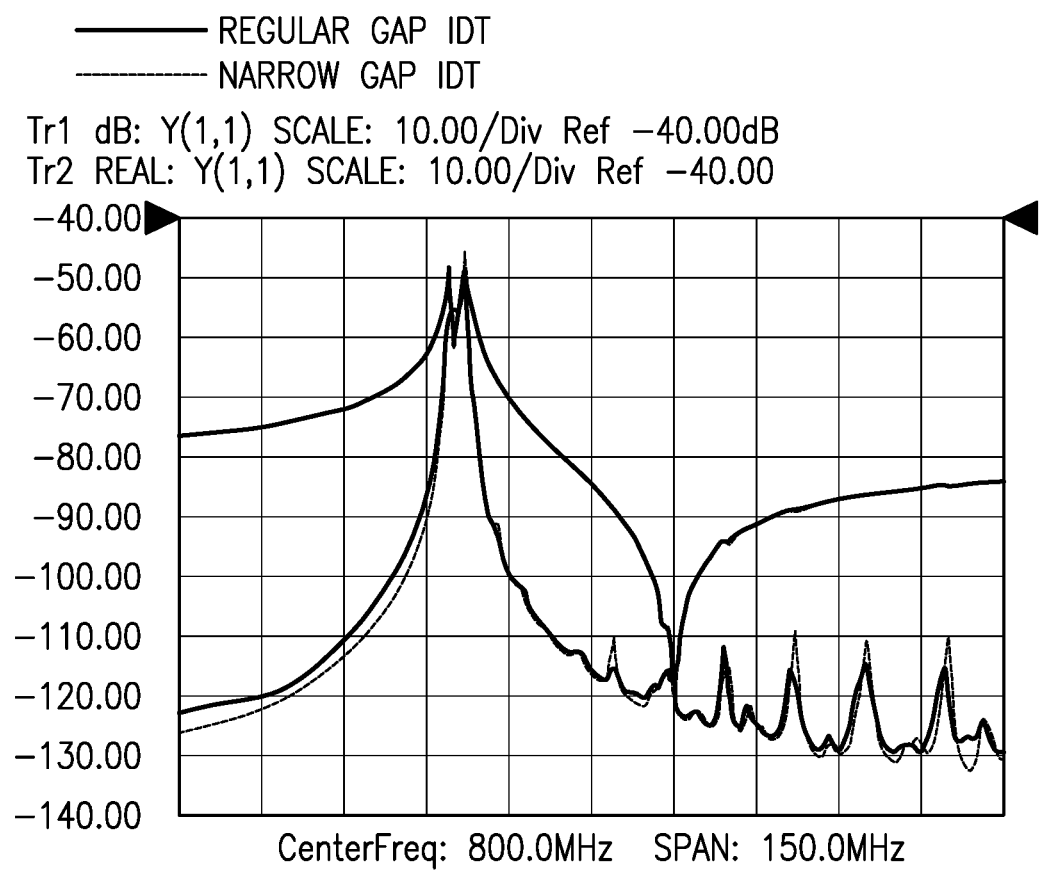
FIG. 9D illustrates the effect on the admittance curve of a SAW resonator when the width of the IDT electrodes in the gap regions is reduced.
Figure 9E:
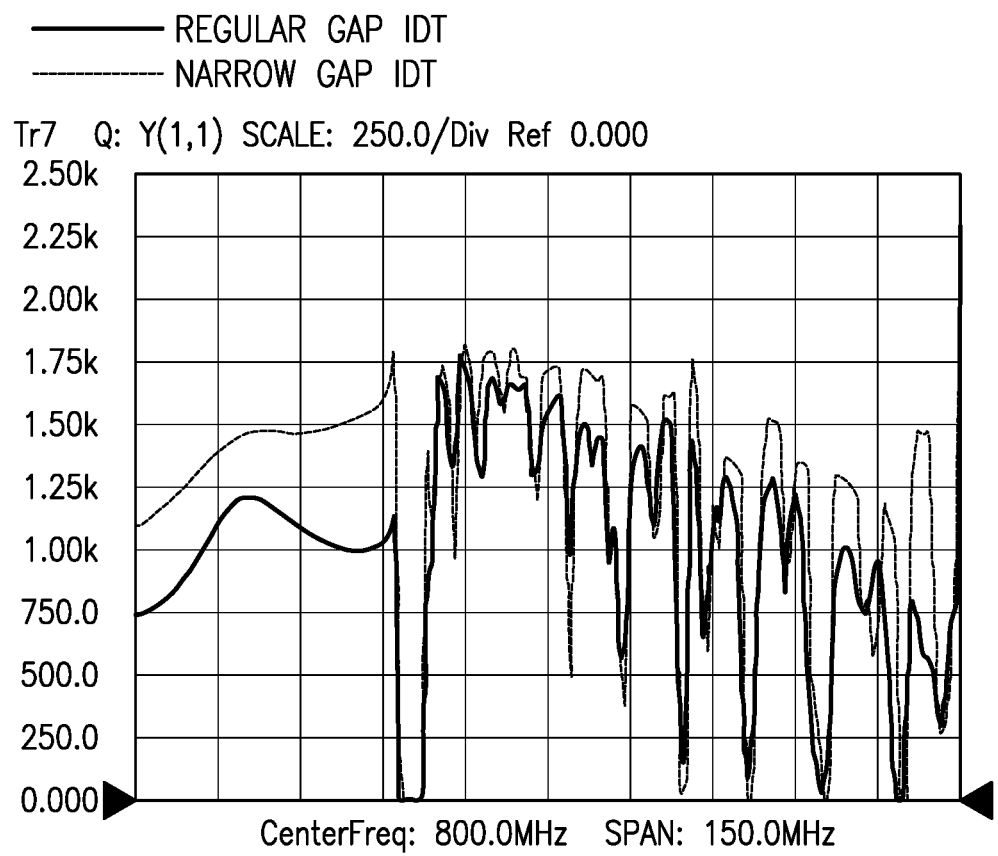
FIG. 9E illustrates the effect on the quality factor curve of a SAW resonator when the width of the IDT electrodes in the gap regions is reduced.

Simulations were performed comparing the performance of SAW resonators having IDT electrode hammers and IDT electrodes with the same duty factors in the center and gap regions against SAW resonators having IDT electrode hammers and IDT electrodes that were narrower in the gap regions than in the center regions as illustrated in FIG. 9A. The results of these simulations are shown in FIGS. 9D and 9E. These results show that the resonator with the IDT electrodes having narrow portions in the gap regions exhibit a higher Q factor (FIG. 9E) that the resonator with the IDT electrodes having the same widths in the center and gap regions. The resonator with the IDT electrodes having narrow portions in the gap regions exhibited slightly elevated transverse spurious mode signals in its admittance curve (FIG. 9D) than the resonator with the IDT electrodes having the same widths in the center and gap regions.

Figure 10A:
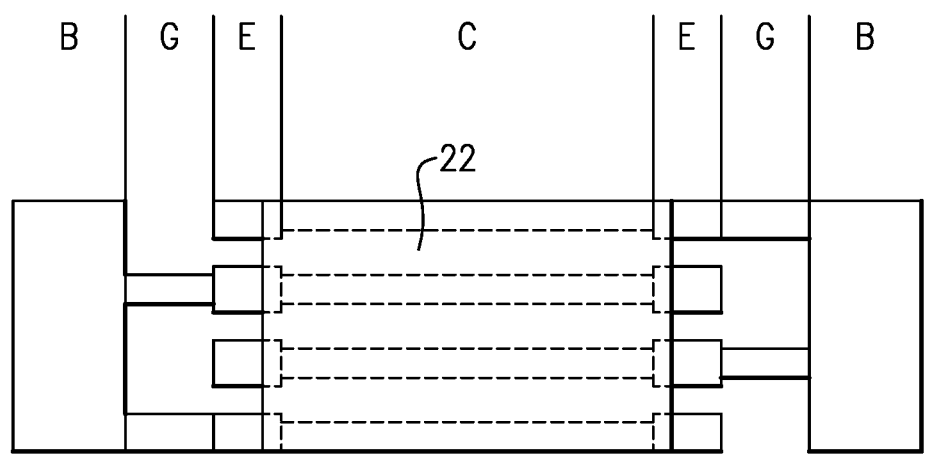
FIG. 10A illustrates a SAW resonator including edge hammers and high-density film strips in its $SiO_2$ layer in the edge regions.
Figure 10A:
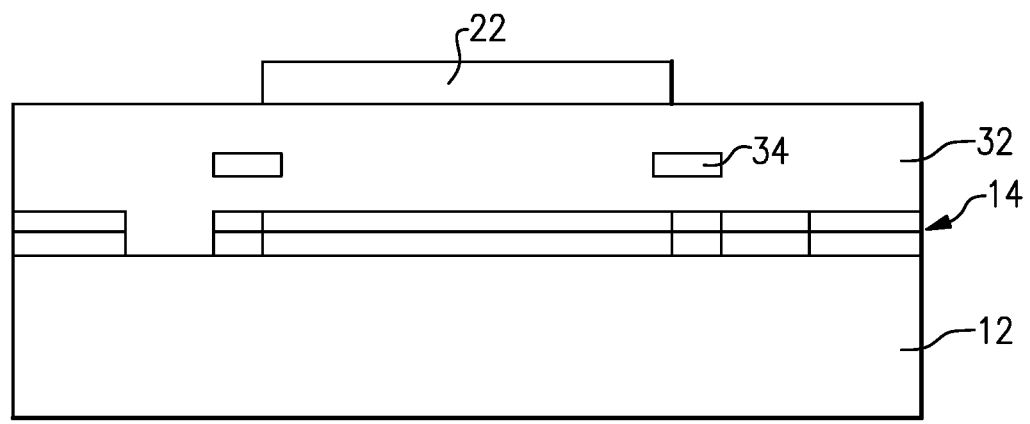
Figure 10B:
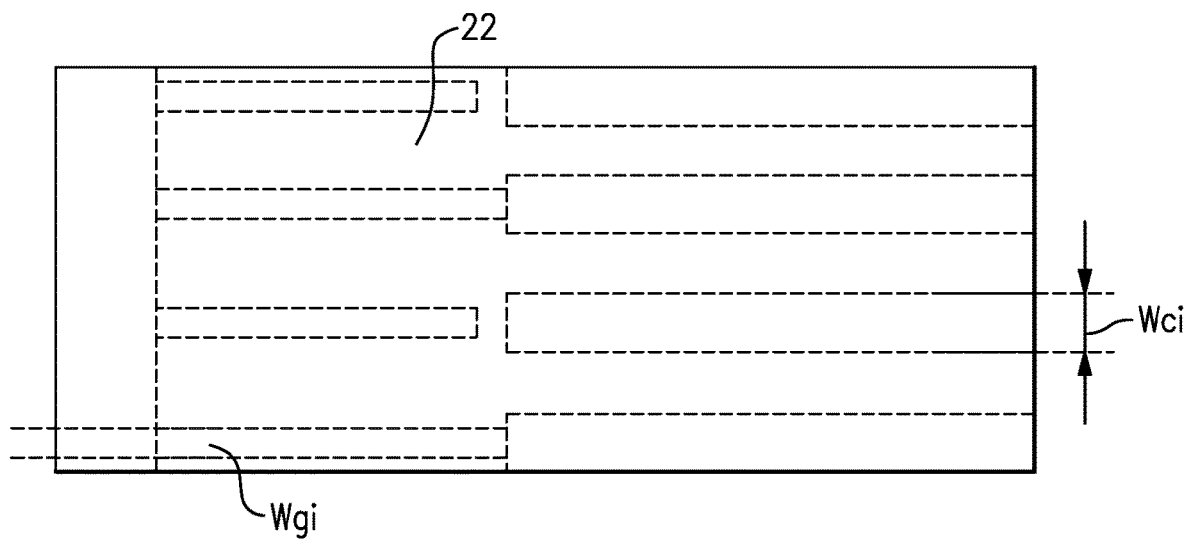
FIG. 10B illustrates a SAW resonator including IDT and dummy electrode fingers with portions having reduced widths in its edge regions and high-density film strips in its $SiO_2$ layer in the edge regions.
Figure 10B:
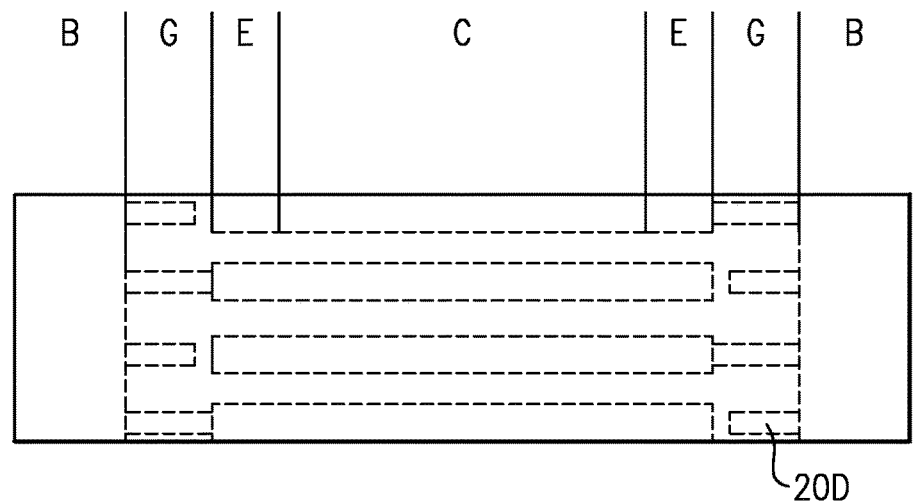
Figure 10B:
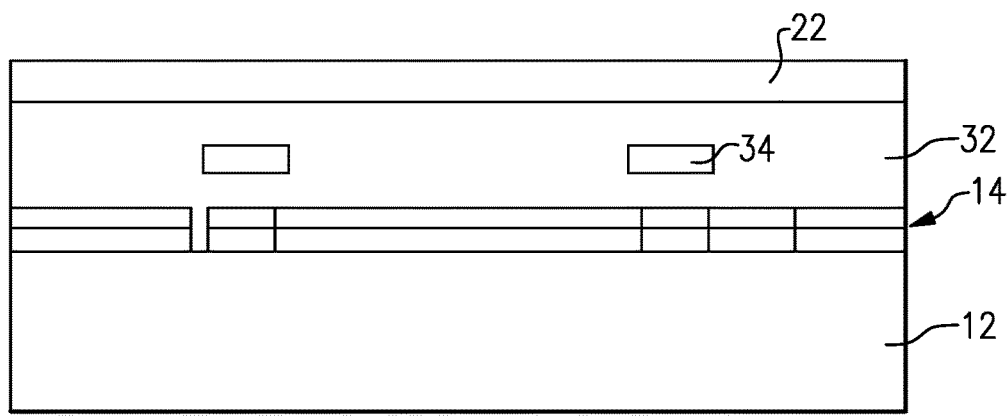
Figure 10C:
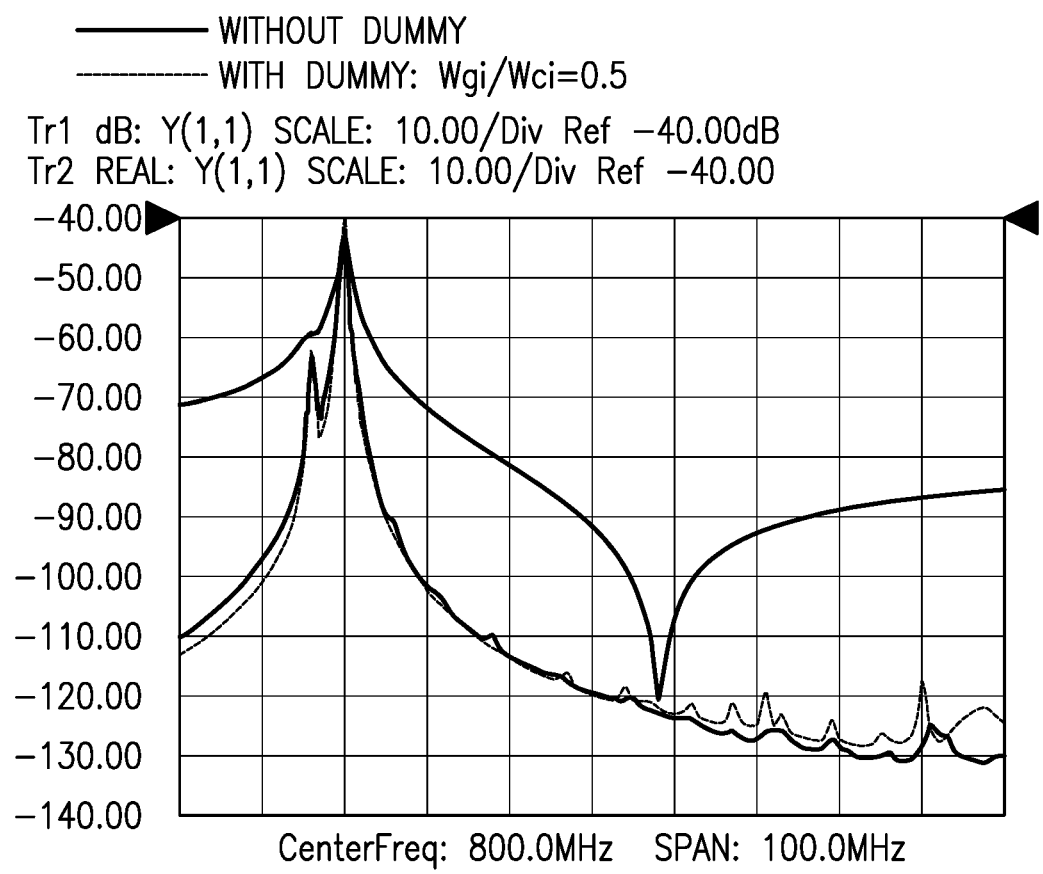
FIG. 10C illustrates a comparison between the admittance curves of the resonators of FIGS. 10A and 10B.
Figure 10D:
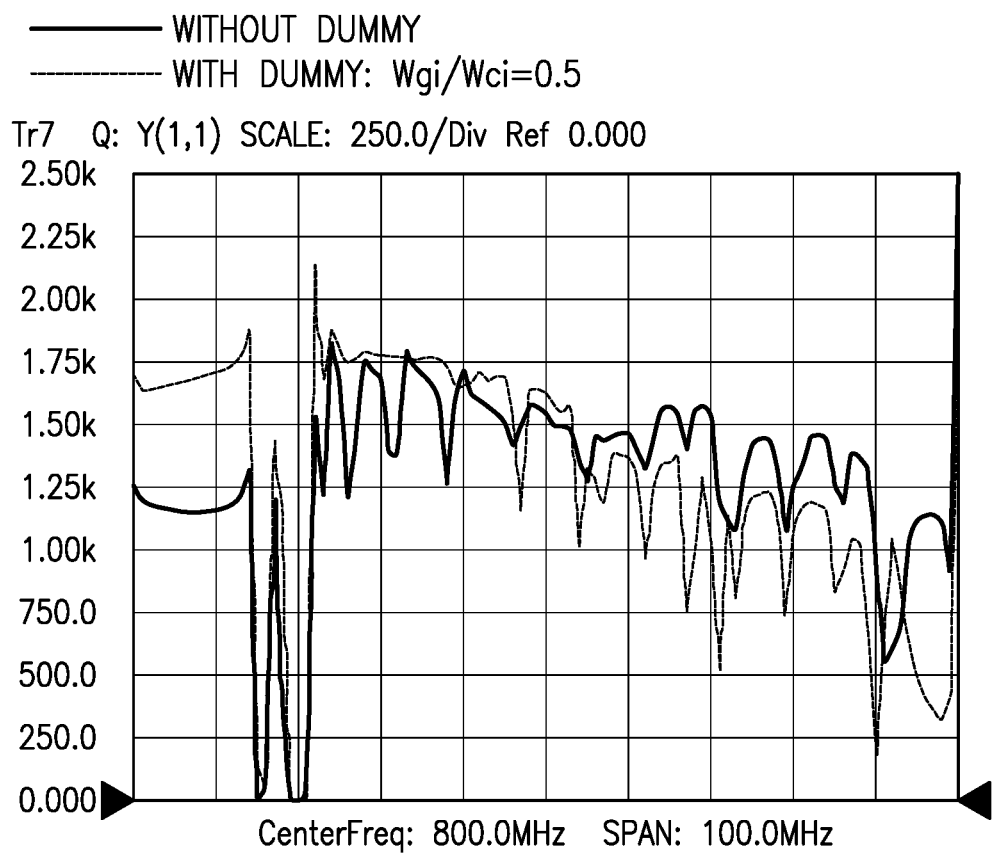
FIG. 10D illustrates a comparison between the quality factor curves of the resonators of FIGS. 10A and 10B.

In further embodiments, a strip of a high-density material, for example, a metal or a dielectric with a density greater than $SiO_2$, such as illustrated in FIG. 2C may be included in a SAW device having IDT electrode hammers in the edge regions and/or with IDT electrodes and/or dummy electrodes that are narrower in the gap regions than in the edge or center regions. Simulations were performed to compare the performance of a SAW resonator including IDT electrode hammers in the edge regions and high-density material strips 34 located in the $SiO_2$ layer in the edge regions, but without dummy electrodes, as illustrated in FIG. 10A (the "Without Dummy" resonator) to another SAW resonator including high-density strips 34 located in the $SiO_2$ layer in the edge regions and narrow IDT and dummy electrodes 20D in the edge regions, as illustrated in FIG. 10B (the "With Dummy" resonator). In the "With Dummy" resonator of FIG. 10B, the width of the IDTs in the gap region (Wgi) was 0.5 times the width of the IDT electrodes in the center region (Wci) and edge regions (Wei) and the duty factor of the dummy electrode fingers was 0.25. As illustrated in FIG. 10C, the "With Dummy" resonator exhibited a slightly sharper resonance peak, but some additional spurious signals at frequencies above the anti-resonance frequency in its admittance curve as compared to the "Without Dummy" resonator. As illustrated in FIG. 10D, "With Dummy" resonator exhibited a significant improvement in Q factor about its resonant frequency as compared to the "Without Dummy" resonator.

Figure 11:
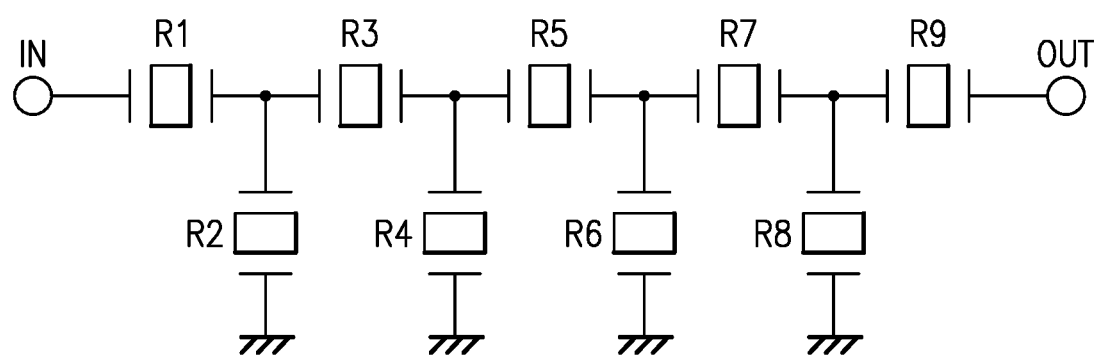
FIG. 11 is a schematic diagram of a radio frequency ladder filter.

In some embodiments, multiple SAW resonators as disclosed herein may be combined into a filter, for example, an RF ladder filter schematically illustrated in FIG. 11 and including a plurality of series resonators R1, R3, R5, R7, and R9, and a plurality of parallel resonators R2, R4, R6, and R8. Other filter structures and other circuit structures known in the art that may include SAW devices or resonators, for example, duplexers, baluns, etc., may also be formed including examples of SAW resonators as disclosed herein.

Figure 12:
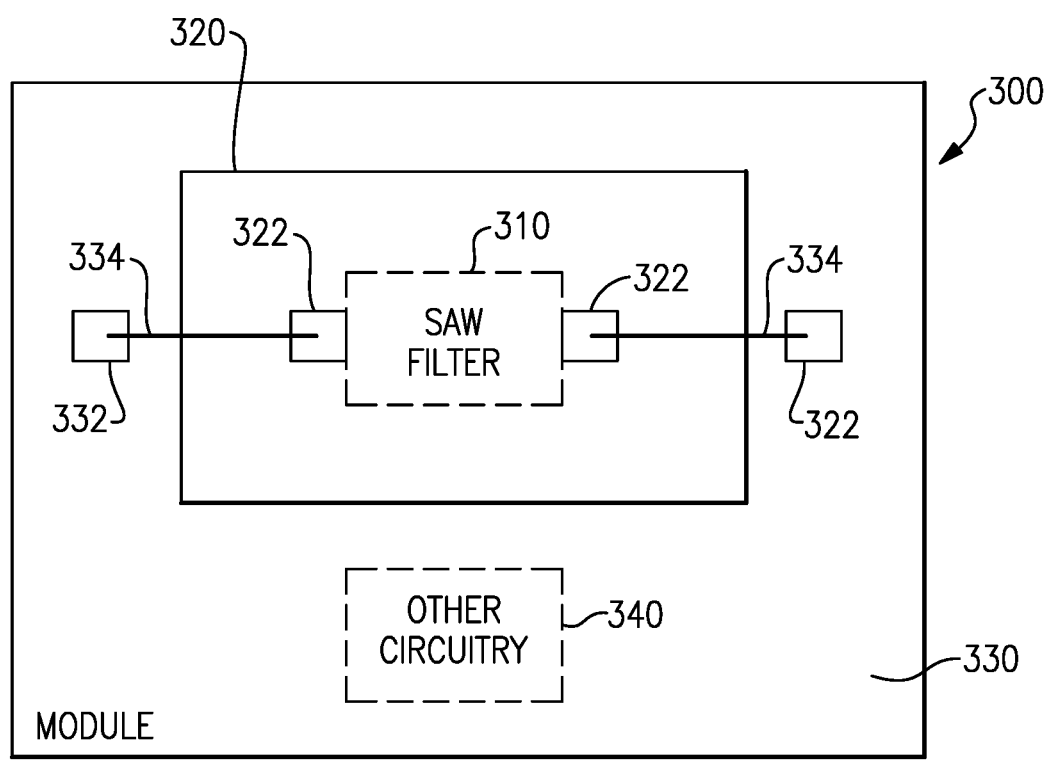
FIG. 12 is a block diagram of one example of a filter module that can include one or more surface acoustic wave resonators according to aspects of the present disclosure.
Figure 13:
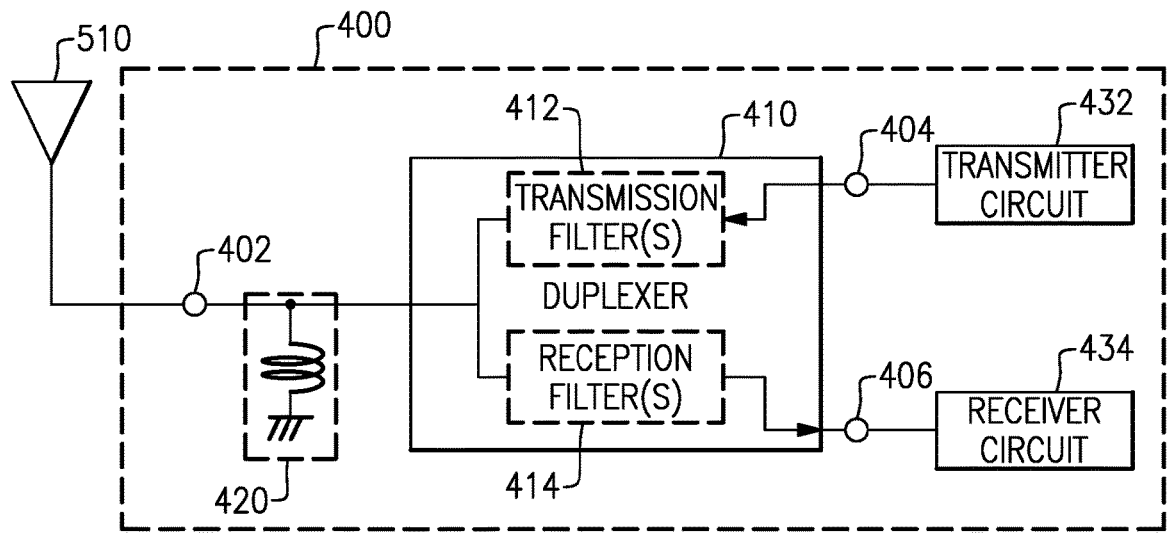
FIG. 13 is a block diagram of one example of a front-end module that can include one or more filter modules according to aspects of the present disclosure.
Figure 14:
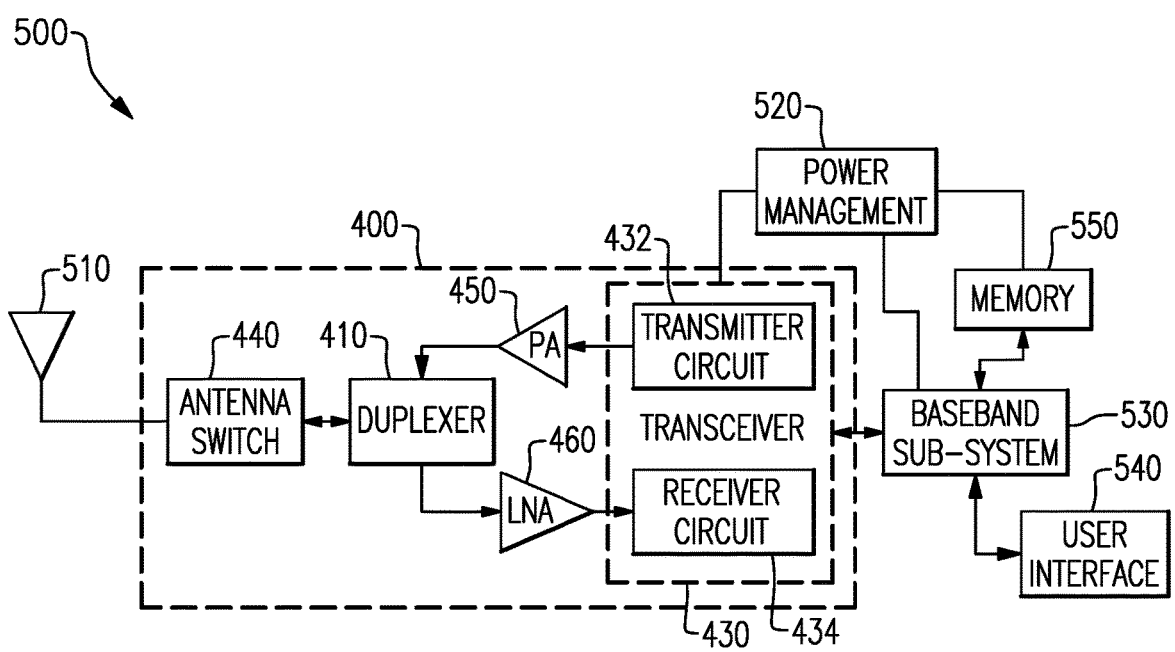
FIG. 14 is a block diagram of one example of a wireless device including the front-end module of FIG. 13.

The acoustic wave resonators discussed herein can be implemented in a variety of packaged modules. Some example packaged modules will now be discussed in which any suitable principles and advantages of the packaged acoustic wave resonators discussed herein can be implemented. FIGS. 12, 13, and 14 are schematic block diagrams of illustrative packaged modules and devices according to certain embodiments.

As discussed above, embodiments of the surface acoustic wave elements can be configured as or used in filters, for example. In turn, a surface acoustic wave (SAW) filter using one or more surface acoustic wave elements may be incorporated into and packaged as a module that may ultimately be used in an electronic device, such as a wireless communications device, for example. FIG. 12 is a block diagram illustrating one example of a module 300 including a SAW filter 310. The SAW filter 310 may be implemented on one or more die(s) 320 including one or more connection pads 322. For example, the SAW filter 310 may include a connection pad 322 that corresponds to an input contact for the SAW filter and another connection pad 322 that corresponds to an output contact for the SAW filter. The packaged module 300 includes a packaging substrate 330 that is configured to receive a plurality of components, including the die 320. A plurality of connection pads 332 can be disposed on the packaging substrate 330, and the various connection pads 322 of the SAW filter die 320 can be connected to the connection pads 332 on the packaging substrate 330 via electrical connectors 334, which can be solder bumps or wirebonds, for example, to allow for passing of various signals to and from the SAW filter 310. The module 300 may optionally further include other circuitry die 340, for example, one or more additional filter(s), amplifiers, pre-filters, modulators, demodulators, down converters, and the like, as would be known to one of skill in the art of semiconductor fabrication in view of the disclosure herein. In some embodiments, the module 300 can also include one or more packaging structures to, for example, provide protection and facilitate easier handling of the module 300. Such a packaging structure can include an overmold formed over the packaging substrate 330 and dimensioned to substantially encapsulate the various circuits and components thereon. Various examples and embodiments of the SAW filter 310 can be used in a wide variety of electronic devices. For example, the SAW filter 310 can be used in an antenna duplexer, which itself can be incorporated into a variety of electronic devices, such as RF front-end modules and communication devices.

Referring to FIG. 13, there is illustrated a block diagram of one example of a front-end module 400, which may be used in an electronic device such as a wireless communications device (e.g., a mobile phone) for example. The front-end module 400 includes an antenna duplexer 410 having a common node 402, an input node 404, and an output node 406. An antenna 510 is connected to the common node 402.

The antenna duplexer 410 may include one or more transmission filters 412 connected between the input node 404 and the common node 402, and one or more reception filters 414 connected between the common node 402 and the output node 406. The passband(s) of the transmission filter(s) are different from the passband(s) of the reception filters. Examples of the SAW filter 310 can be used to form the transmission filter(s) 412 and/or the reception filter(s) 414. An inductor or other matching component 420 may be connected at the common node 402.

The front-end module 400 further includes a transmitter circuit 432 connected to the input node 404 of the duplexer 410 and a receiver circuit 434 connected to the output node 406 of the duplexer 410. The transmitter circuit 432 can generate signals for transmission via the antenna 510, and the receiver circuit 434 can receive and process signals received via the antenna 510. In some embodiments, the receiver and transmitter circuits are implemented as separate components, as shown in FIG. 13, however in other embodiments these components may be integrated into a common transceiver circuit or module. As will be appreciated by those skilled in the art, the front-end module 400 may include other components that are not illustrated in FIG. 13 including, but not limited to, switches, electromagnetic couplers, amplifiers, processors, and the like.

FIG. 14 is a block diagram of one example of a wireless device 500 including the antenna duplexer 410 shown in FIG. 13. The wireless device 500 can be a cellular phone, smart phone, tablet, modem, communication network or any other portable or non-portable device configured for voice or data communication. The wireless device 500 can receive and transmit signals from the antenna 510. The wireless device includes an embodiment of a front-end module 400 similar to that discussed above with reference to FIG. 13. The front-end module 400 includes the duplexer 410, as discussed above. In the example shown in FIG. 14 the front-end module 400 further includes an antenna switch 440, which can be configured to switch between different frequency bands or modes, such as transmit and receive modes, for example. In the example illustrated in FIG. 14, the antenna switch 440 is positioned between the duplexer 410 and the antenna 510; however, in other examples the duplexer 410 can be positioned between the antenna switch 440 and the antenna 510. In other examples the antenna switch 440 and the duplexer 410 can be integrated into a single component.

The front-end module 400 includes a transceiver 430 that is configured to generate signals for transmission or to process received signals. The transceiver 430 can include the transmitter circuit 432, which can be connected to the input node 404 of the duplexer 410, and the receiver circuit 434, which can be connected to the output node 406 of the duplexer 410, as shown in the example of FIG. 13.

Signals generated for transmission by the transmitter circuit 432 are received by a power amplifier (PA) module 450, which amplifies the generated signals from the transceiver 430. The power amplifier module 450 can include one or more power amplifiers. The power amplifier module 450 can be used to amplify a wide variety of RF or other frequency-band transmission signals. For example, the power amplifier module 450 can receive an enable signal that can be used to pulse the output of the power amplifier to aid in transmitting a wireless local area network (WLAN) signal or any other suitable pulsed signal. The power amplifier module 450 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 450 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 14, the front-end module 400 may further include a low noise amplifier module 460, which amplifies received signals from the antenna 510 and provides the amplified signals to the receiver circuit 434 of the transceiver 430.

The wireless device 500 of FIG. 14 further includes a power management sub-system 520 that is connected to the transceiver 430 and manages the power for the operation of the wireless device 500. The power management system 520 can also control the operation of a baseband sub-system 530 and various other components of the wireless device 500. The power management system 520 can include, or can be connected to, a battery (not shown) that supplies power for the various components of the wireless device 500. The power management system 520 can further include one or more processors or controllers that can control the transmission of signals, for example. In one embodiment, the baseband sub-system 530 is connected to a user interface 540 to facilitate various input and output of voice and/or data provided to and received from the user. The baseband sub-system 530 can also be connected to memory 550 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 5 GHz, such as in a range from about 600 MHz to 2.7 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An acoustic wave device comprising:
a substrate including a piezoelectric material;
interdigital transducer (IDT) electrodes disposed on an upper surface of the substrate, the IDT electrodes having gap regions, edge regions, and center regions, a duty factor of the IDT electrodes in the edge regions being greater than a duty factor of the IDT electrodes in the center regions;
a first dielectric film disposed above the IDT electrodes and an upper surface of the substrate, the first dielectric film having a greater thickness in portions of the center regions than in portions proximate the gap regions; and
a second dielectric film disposed between the first dielectric film and the IDT electrodes, the second dielectric film exhibiting a lower acoustic velocity than the first dielectric film.

2. The acoustic wave device of claim 1 wherein a velocity of an acoustic wave in the center regions is greater than the velocity of the acoustic wave in the edge regions.

3. The acoustic wave device of claim 1 wherein the first dielectric film has a greater thickness in the center regions and portions of the edge regions proximate the center regions than in portions of the edge regions distal to the center regions.

4. The acoustic wave device of claim 3 wherein lengths of the portions of the edge regions proximate the center regions are less than lengths of the portions of the edge regions distal to the center regions.

5. The acoustic wave device of claim 3 wherein lengths of the portions of the edge regions proximate the center regions are at least as long as lengths of the portions of the edge regions distal to the center regions.

6. The acoustic wave device of claim 1 wherein the IDT electrodes include a layer of tungsten.

7. The acoustic wave device of claim 1 further comprising strips of a material having a density higher than the density of the second dielectric film disposed in the second dielectric film in the edge regions.

8. The acoustic wave device of claim 1 wherein widths of the IDT electrodes in the gap regions is less than widths of the IDT electrodes in the center regions.

9. The acoustic wave device of claim 1 further comprising dummy IDT electrodes disposed in the gap regions.

10. The acoustic wave device of claim 9 wherein a duty factor of the dummy IDT electrodes is different from the duty factor of the IDT electrodes in the center regions and different from the duty factor of the IDT electrodes in the edge regions.

11. The acoustic wave device of claim 10 wherein the duty factor of the dummy IDT electrodes is less than the duty factor of the IDT electrodes in the center regions and less than the duty factor of the IDT electrodes in the edge regions.

12. An acoustic wave device comprising:
a substrate including a piezoelectric material;
interdigital transducer (IDT) electrodes disposed on an upper surface of the substrate, the IDT electrodes having gap regions, edge regions, and center regions, a width of the IDT electrodes in the gap regions being less than a width of the IDT electrodes in the center regions; and
dummy IDT electrodes disposed in the gap regions.

13. The acoustic wave device of claim 12 wherein a duty factor of the IDT electrodes in the edge regions is greater than a duty factor of the IDT electrodes in the center regions.

14. The acoustic wave device of claim 12 wherein a duty factor of the dummy IDT electrodes is different from the duty factor of the IDT electrodes in the center regions and different from a duty factor of the IDT electrodes in the edge regions.

15. The acoustic wave device of claim 14 wherein the duty factor of the dummy IDT electrodes is less than the duty factor of the IDT electrodes in the center regions and less than the duty factor of the IDT electrodes in the edge regions.

16. An acoustic wave device comprising:
- a substrate including a piezoelectric material;
- interdigital transducer (IDT) electrodes disposed on an upper surface of the substrate, the IDT electrodes having gap regions, edge regions, and center regions, a duty factor of the IDT electrodes in the edge regions being greater than a duty factor of the IDT electrodes in the center regions; and
- a first dielectric film disposed above the IDT electrodes and an upper surface of the substrate, the first dielectric film having a greater thickness in portions of the center regions than in portions proximate the gap regions, the first dielectric film having a greater thickness in the center regions and portions of the edge regions proximate the center regions than in portions of the edge regions distal to the center regions, lengths of the portions of the edge regions proximate the center regions being at least as long as lengths of the portions of the edge regions distal to the center regions.

17. An acoustic wave device comprising:
- a substrate including a piezoelectric material;
- interdigital transducer (IDT) electrodes disposed on an upper surface of the substrate, the IDT electrodes having gap regions, edge regions, and center regions, a duty factor of the IDT electrodes in the edge regions being greater than a duty factor of the IDT electrodes in the center regions, widths of the IDT electrodes in the gap regions being less than the widths of the IDT electrodes in the center regions;
- a first dielectric film disposed above the IDT electrodes and an upper surface of the substrate, the first dielectric film having a greater thickness in portions of the center regions than in portions proximate the gap regions.

18. An acoustic wave device comprising:
- a substrate including a piezoelectric material;
- interdigital transducer (IDT) electrodes disposed on an upper surface of the substrate, the IDT electrodes having gap regions, edge regions, and center regions, a duty factor of the IDT electrodes in the edge regions being greater than a duty factor of the IDT electrodes in the center regions;
- a first dielectric film disposed above the IDT electrodes and an upper surface of the substrate, the first dielectric film having a greater thickness in portions of the center regions than in portions proximate the gap regions; and
- dummy IDT electrodes disposed in the gap regions, a duty factor of the dummy IDT electrodes being different from the duty factor of the IDT electrodes in the center regions and different from the duty factor of the IDT electrodes in the edge regions.

19. An acoustic wave device comprising:
- a substrate including a piezoelectric material;
- interdigital transducer (IDT) electrodes disposed on an upper surface of the substrate, the IDT electrodes having gap regions, edge regions, and center regions, a duty factor of the IDT electrodes in the edge regions being greater than a duty factor of the IDT electrodes in the center regions; and
- a first dielectric film disposed above the IDT electrodes and an upper surface of the substrate, the first dielectric film having a greater thickness in portions of the center regions than in portions proximate the gap regions, the first dielectric film having a greater thickness in the center regions and portions of the edge regions proximate the center regions than in portions of the edge regions distal to the center regions, lengths of the portions of the edge regions proximate the center regions being less than lengths of the portions of the edge regions distal to the center regions.

* * * * *

UNITED STATES PATENT AND TRADEMARK OFFICE
CERTIFICATE OF CORRECTION

| | |
|---|---|
| PATENT NO. | : 11,444,599 B2 |
| APPLICATION NO. | : 17/001843 |
| DATED | : September 13, 2022 |
| INVENTOR(S) | : Riho Sasaki et al. |

It is certified that error appears in the above-identified patent and that said Letters Patent is hereby corrected as shown below:

On the Title Page

(72) Inventors: delete "Riho Sasaki, Osaka-Fu (JP); Joji Fujiwara, Suita (JP)" and insert -- Riho Sasaki, Osaka-Fu (JP); Joji Fujiwara, Suita-Shi (JP) --

Signed and Sealed this
First Day of November, 2022

*Katherine Kelly Vidal*
Katherine Kelly Vidal
*Director of the United States Patent and Trademark Office*